(12) United States Patent
Takeda

(10) Patent No.: US 8,082,640 B2
(45) Date of Patent: Dec. 27, 2011

(54) METHOD FOR MANUFACTURING A FERROELECTRIC MEMBER ELEMENT STRUCTURE

(75) Inventor: Kenichi Takeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 811 days.

(21) Appl. No.: 11/211,518

(22) Filed: Aug. 26, 2005

(65) Prior Publication Data

US 2006/0046319 A1 Mar. 2, 2006

(30) Foreign Application Priority Data

Aug. 31, 2004 (JP) .................................. 2004-253540

(51) Int. Cl.
*H04R 17/00* (2006.01)
*B21D 53/76* (2006.01)

(52) U.S. Cl. .......... 29/25.35; 29/890.1; 29/846; 347/68; 347/71; 310/328; 310/363

(58) Field of Classification Search ................ 29/25.35, 29/890.1, 831, 846; 347/68, 70–72; 361/321.1; 438/3, 21; 216/27; 310/328, 363
See application file for complete search history.

(56) References Cited

U.S. PATENT DOCUMENTS

| 5,270,298 | A | * | 12/1993 | Ramesh | ...................... 361/321.1 |
| 5,431,958 | A | | 7/1995 | Desu et al. | |
| 5,984,458 | A | * | 11/1999 | Murai | ............................... 347/68 |
| 6,198,208 | B1 | | 3/2001 | Yano et al. | |
| 6,599,757 | B1 | * | 7/2003 | Murai | ................................ 438/3 |
| 7,045,935 | B2 | | 5/2006 | Matsuda et al. | |
| 7,059,711 | B2 | | 6/2006 | Aoto et al. | |
| 2005/0168112 | A1 | | 8/2005 | Aoki et al. | |
| 2005/0189849 | A1 | | 9/2005 | Ifuku et al. | |
| 2006/0012648 | A1 | | 1/2006 | Ifuku et al. | |
| 2006/0049135 | A1 | | 3/2006 | Okabe et al. | |

FOREIGN PATENT DOCUMENTS

| JP | 04285025 A | * 10/1992 |
| JP | 6-280023 | 10/1994 |
| JP | 2000-332569 | 11/2000 |

* cited by examiner

*Primary Examiner* — A. Dexter Tugbang

(74) *Attorney, Agent, or Firm* — Fitzpatrick, Cella, Harper & Scinto

(57) ABSTRACT

A method for manufacturing a ferroelectric member element structure having a ferroelectric member film, and lower and upper electrodes between which the ferroelectric member film is sandwiched, includes the steps of: forming a buffer layer having pattern-shaped oriented growth on a monocrystal substrate; performing oriented growth of the lower electrode layer on the buffer layer; performing oriented growth of the ferroelectric member film to cover the buffer layer and the lower electrode layer; and removing a portion of the ferroelectric member film other than the portion having the oriented growth achieved along the pattern of the buffer layer, by means of an etching treatment.

20 Claims, 14 Drawing Sheets

METHOD FOR MANUFACTURING A FERROELECTRIC MEMBER ELEMENT STRUCTURE

BACKGROUND OF THE INVENTION

1. Field of the Invention

The present invention relates to a ferroelectric member element structure applicable to a semiconductor storing device such as a non-volatile memory using a film having a material property such as a piezoelectric property, a pyroelectric property, a ferroelectric property or the like, a piezoelectric element, an ultrasonic appliance element, an electrooptical element, a pyroelectric element, a ferroelectric member element or the like, and a method for manufacturing the same, and more particularly, it relates to a method for manufacturing a liquid jet head using piezoelectric material.

2. Related Background Art

A piezoelectric/electrostrictive member element structure using piezoelectric, pyroelectric or ferroelectric material such as a semiconductor storing device, for example, a non-volatile memory, a surface acoustic wave element, a bulk ultrasonic element, an acceleration sensor, a piezoelectric actuator or a pyroelectric infrared ray sensing element has conventionally been manufactured, for example, by adhering a machined monocrystal substrate or a polycrystal sintered member to a substrate. Recently, in order to meet requirements for compactness, high density, light weight and high function of the apparatus, it has been tried to use monocrystal material. However, since a method for manufacturing the element by machining such monocrystal material has some limitations, a technique in which the monocrystal material is film-formed on a monocrystal substrate and an assembly so obtained is formed as a device has widely been investigated and developed. For example, a film piezoelectric member element such as a film vibrator or a piezoelectric actuator used as a key component in information communicating equipment, television sets and the like is an apparatus which is constituted by a piezoelectric member and a plurality of electrodes provided on the piezoelectric member and in which electric energy is converted into mechanical energy by applying voltage between the electrodes. Further, in moving member communication markets, a surface acoustic wave (SAW) device or a film bulk acoustic resonator (FBAR) is used as an RF filter and/or an IF filter.

Further, in recent years, printers in which a liquid jet recording apparatus is used as an output device for a personal computer and the like have widely been popularized because they have good printing performance, are easy to handle and are economical. The liquid jet recording apparatuses are of various types including a type in which a bubble is generated in liquid such as ink by thermal energy and a liquid droplet is discharged by a pressure wave caused by the bubble, a type in which a liquid droplet is sucked and discharged by an electrostatic force, a type in which a pressure wave caused by a vibrator such as a piezoelectric/electrostrictive element is utilized, and the like.

In general, a liquid jet apparatus (referred to as "liquid jet head" hereinafter) using the piezoelectric/electrostrictive element is constituted, for example, in such a manner that it includes a pressure chamber communicated with a liquid supplying chamber and a liquid discharge port communicated with the pressure chamber and a vibrator plate to which the piezoelectric/electrostrictive element is joined is provided in the pressure chamber. By applying predetermined voltage to the piezoelectric/electrostrictive element to expand and contract the piezoelectric/electrostrictive element, the vibrator plate is flexed and vibrated, with the result that the liquid in the pressure chamber is compressed, thereby discharging the liquid droplet from the liquid discharge port.

In recent years, since enhancement of the printing performance, higher resolving power, higher printing speed and longer size of the liquid jet head have been requested, it has been tried that the high resolving power and the higher printing speed are realized by using a multi-nozzle head structure in which miniaturized liquid jet heads are provided. In order to miniaturize the liquid jet head, it is necessary that the piezoelectric/electrostrictive element for discharging the liquid be formed to have compactness, high density and high performance, and, for example, in order to make the elongated liquid jet head, it is necessary that the substrate from which the liquid jet head is formed has a large area.

In the actuator and liquid jet head having the above-mentioned piezoelectric/electrostrictive member element structure, in order to achieve the compactness and high density of the element, it is necessary to give the element to a high piezoelectric/electrostrictive property enough to prevent reduction of the effective driving ability even if the element is made compact. As one of methods for achieving this, it is considered that crystallization of the piezoelectric/electrostrictive member film is enhanced. To this end, there are proposed a uni-directionally oriented film in which crystals are oriented in the same direction and a monocrystal film in which crystals are aligned with each other in longitudinal and width-wise directions and even in a depth-wise direction. In order to manufacture such uni-directionally oriented or monocrystal piezoelectric/electrostrictive member film, upon manufacturing the monocrystal piezoelectric/electrostrictive member film, it is necessary that an immediately underlying layer be monocrystal and good grating matching between the piezoelectric/electrostrictive member film and the underlying layer be maintained.

As definition for such a uni-directionally oriented film, also as described in Japanese Patent Application Laid-open No. 2000-332569, it means a film in which crystal surfaces of interest are aligned in parallel with the surface of the substrate. For example, a (001) uni-directionally oriented film means a film in which a (001) face is disposed in parallel with the surface of the film, and more particularly, is a film in which, when measurement by means of X-ray diffraction is performed, reflection peak intensities of faces other than the face of interest show 10% or less, preferably 5% or less of maximum peak intensity of the face of interest.

Further, in this specification, the monocrystal film may be an epitaxial film that is a uni-directionally oriented film in which, when it is assumed that a face in the film is an X-Y face and a film thickness direction is a Z axis, crystals are aligned and oriented along all of X, Y and Z axes. More particularly, when the measurement by means of X-ray diffraction is performed, it is necessary that the reflection peak intensities of the faces other than the face of interest show 10% or less, preferably 5% or less of the maximum peak intensity of the face of interest. In the present invention, a crystal having high orientation means that, in the X-ray diffraction, crystals having specific orientation in the specific crystal structure exceeds 50% or more, and preferably exceeds 80% or more, and more preferably 99% or more.

For example, as materials having the good grating matching between a PZT piezoelectric member film and the underlying layer, a buffer layer including $ZrO_2$, a stabilized zirconia film, a rare earth element oxide film and the like are proposed in the above-mentioned Japanese Patent Application Laid-open No. 2000-332569, and a buffer layer using SRO which can also be used as electrode material is proposed, as described in Japanese Patent Application Laid-open No. H6-280023.

In a case where a YSZ film as a buffer layer, a Pt film as a lower electrode and a PZT film as a piezoelectric/electrostrictive member layer are oriented and laminated in order on an Si monocrystal substrate having a large area such as a 6-inch wafer, there will cause a problem that great stress is applied to interfaces between these layers including the substrate to curve the substrate including the laminated layers and to peel any of the laminated films from its interface. The stress acting on the interfaces between the laminated films tends to increase as the crystallization of the PZT oriented film is increased, with the result that there exists antinomy between the increase in the area and enhancement of the film performance obtained by enhancement of the crystallization and that mass-production is limited.

Further, when the oriented piezoelectric/electrostrictive member film and/or monocrystal piezoelectric/electrostrictive member film so film-formed is structured by etching to form the device, in the above-mentioned laminated structure, there will arise a problem that etching grade is lowered and workability is worsened, in comparison with the polycrystal piezoelectric/electrostrictive member film. This problem leads to secondary evils such as change in configuration and deterioration of the film performance during the device working and arise a further problem in the miniaturizing process. Further, if the piezoelectric/electrostrictive member film having such high crystallization is configured to be used as an actuator such as a liquid jet head and is driven, there will arise a problem that peeling is apt to occur at any interface between the piezoelectric/electrostrictive member film, electrode, buffer material and substrate, and stability of discharging and endurance of the apparatus are worsened. As mentioned above, it is considered that these problems are arisen on the basis of the stress accumulated during the formation of the laminated layers.

SUMMARY OF THE INVENTION

An object of the present invention is to solve a problem that a layer construction cannot be simplified due to the fact that a monocrystal layer on a monocrystal substrate is influenced by stress at an interface between the layer and the monocrystal substrate, in a lamination including monocrystal oxide on the monocrystal substrate applicable to a piezoelectric/electrostrictive member element structure such as a semiconductor device, a piezoelectric actuator and the like, and to provide a method for manufacturing a structure such as a device on a monocrystal substrate with a simple arrangement.

The present invention is made in consideration of the above-mentioned non-solved problems and another object of the present invention is to provide an element in which miniaturization and area-increasing generally used in a semiconductor process can be realized and which has excellent endurance and piezoelectric/electrostrictive property, and to provide a method for manufacturing such an element.

A further object of the present invention is to provide a piezoelectric/electrostrictive member element structure having excellent endurance and excellent piezoelectric property which is one of ferroelectric properties and to provide a method for manufacturing a liquid jet head which is elongated and has liquid discharge ports arranged with high density and has high stable reliability.

A still further object of the present invention is to provide a method for manufacturing a ferroelectric member element structure having a ferroelectric film, and lower and upper electrodes between which the ferroelectric film is sandwiched, the method comprising the steps of forming a buffer layer having pattern-shaped oriented growth on a monocrystal substrate, performing oriented growth of the lower electrode layer on the buffer layer, performing oriented growth of the ferroelectric member film to cover the buffer layer and the lower electrode layer, and removing a portion of the ferroelectric member film other than the portion having the oriented growth achieved along the pattern of the buffer layer, by means of an etching treatment.

A further object of the present invention is to provide a method for manufacturing a ferroelectric member element structure having a ferroelectric member film, and lower and upper electrodes between which the ferroelectric member film is sandwiched, the method comprising the steps of forming a buffer layer having oriented growth on a monocrystal substrate, forming the lower electrode layer having pattern-shaped oriented growth on the buffer layer, performing oriented growth of the ferroelectric member film to cover the buffer layer and the lower electrode layer, and removing a portion of the ferroelectric member film other than the portion having the oriented growth achieved along the pattern of the lower electrode layer, by means of an etching treatment.

A still further object of the present invention is to provide a method for manufacturing a liquid jet head comprising a liquid chamber communicated with a discharge port for discharging liquid, and a ferroelectric member element structure provided in correspondence to the liquid chamber and having a ferroelectric member film, and lower and upper electrodes between which the ferroelectric member film is sandwiched, the method comprising the steps of forming a buffer layer having pattern-shaped oriented growth on a monocrystal substrate, performing oriented growth of the lower electrode layer on the buffer layer, performing oriented growth of the ferroelectric member film to cover the buffer layer and the lower electrode layer, and removing a portion of the ferroelectric member film other than the portion having the oriented growth achieved along the pattern of the buffer layer, by means of an etching treatment.

The other object of the present invention is to provide a method for manufacturing a liquid jet head comprising a liquid chamber communicated with a discharge port for discharging liquid, and a ferroelectric member element structure provided in correspondence to the liquid chamber and having a ferroelectric member film, and lower and upper electrodes between which the ferroelectric member film is sandwiched, the method comprising the steps of forming a buffer layer having oriented growth on a monocrystal substrate, forming the lower electrode layer having pattern-shaped oriented growth on the buffer layer, performing oriented growth of the ferroelectric member film to cover the buffer layer and the lower electrode layer, and removing a portion of the ferroelectric member film other than the portion having the oriented growth achieved along the pattern of the lower electrode layer, by means of an etching treatment.

In the specification, a term "epitaxial growth" means crystal growth in which orientation is achieved not only in a one axial direction but also in a depth-wise direction.

According to the present invention, the following advantages can be obtained:

(1) Since the stress can be more dispersed in comparison with a case where the buffer layer, lower electrode layer and ferroelectric member layer are formed on the large area monocrystal substrate only with the epitaxial film formation or the oriented film formation, the curve and/or peeling of the substrate can be prevented; and (2) Etching grade of the ferroelectric member film can be enhanced and the worked configuration of the etched portions can be made uniform, thereby permitting the miniaturization.

DESCRIPTION OF THE PREFERRED EMBODIMENTS

Figure 5A:
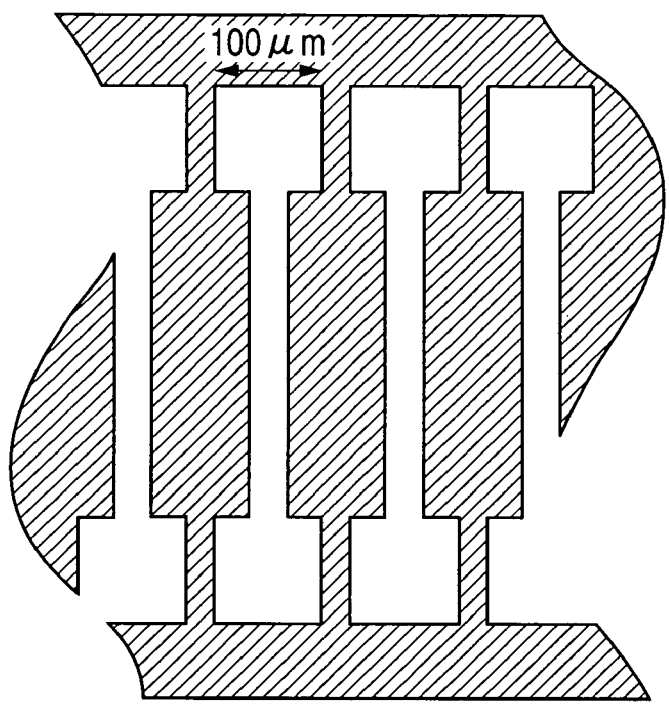
FIGS. 5A and 5B are views showing examples of mask patterns used to solve the problems.

The inventors had investigated buffer materials and electrode materials which are well known as materials having good grading matching between a piezoelectric/electrostrictive member film and an immediately underlying layer in order to obtain a piezoelectric/electrostrictive member film such as, for example, PZT having oriented growth or epitaxial growth on an Si monocrystal substrate having a large area such as, for example, 6 inches; however, the inventors could not find an answer for completely solving the above-mentioned problems. Thus, first of all, in order to solve the problem regarding the peeling at the interfaces between the laminated layers, which is caused due to the increase in the area, in a spattering apparatus, after a metallic mask having a pattern of 100 μm□ as shown in FIG. 5A was placed on a monocrystal Si substrate, a temperature of the substrate was increased to 800° C., and YSZ having (111) orientation and a thickness of 100 nm was oriented and film-formed as a buffer layer. Then, after the metallic mask was removed, the temperature of the substrate was lowered to 600° C., and a Pt electrode having (100) orientation and having a thickness of 100 nm was film-formed on the patterned buffer layer continuously. Then, the temperature of the substrate was increased to 650° C., and PZT having a thickness of 3000 nm was film-formed on the electrode with (100) oriented growth. As this result, it was found that the films could be formed on the large area without the peeling, as desired. By evaluating such crystallization by means of in-plane and out of plane measurement of XDR (ATX-G: manufactured by RIGAKU Co., Ltd.), it was found that the Pt electrode and PZT film, on the portion on which the buffer layer was patterned, exhibited crystallizations having high orientations in which (100) and (001) orientation degrees became 90%, respectively, and, the Pt electrode and PZT film, directly film-formed on the portion of the Si substrate on which the buffer layer was not formed, exhibited (100) and (001) orientation degrees smaller than 50%, respectively. From this result, it can be considered that, since the Pt electrode and PZT film directly film-formed on the portion of the Si substrate on which the buffer layer is not formed have low orientations, the stress acting on the interfaces between the Si substrate, Pt electrode and PZT film is decreased, so that the stress is dispersed in the whole substrate, with the result that the film formation on the large area can be achieved. In order to disperse the stress generated by film formation on the large area substrate, it is more preferable that portions of the buffer layer to be patterned are uniformly dispersed and arranged with respect to the substrate.

Next, the metallic mask was placed again on the PZT film so-formed and a Pt upper electrode having a thickness of 100 nm was formed in a confronting relationship to the patterned buffer layer. In order to evaluate only the PZT having the high orientation (in the X-ray diffraction, (100) orientation degree is 90%) and formed on the buffer layer of the resulting laminated films, by using mixture liquid including water: concentrated nitric acid: concentrated sulfuric acid=2:2:1 (volumetric ratio) as etching liquid for PZT, wet etching was performed on the portion having low crystallization. As a result, it was found that the etching was completed with the etching grade of 6 to 7 nm/min.

In the inventors' investigations, it was found that the etching grade performed on the PZT having high orientation formed on the buffer layer was low as less as 3 to 4 nm/min and, by separately forming the PZT films having different crystallizations on the substrate by patterning at least the buffer layer, the etching grade for the portions not relating to the formation of the structure was enhanced remarkably so that not only the etching time could be reduced greatly but also the configuration of the structure after the etching could be arranged substantially in perpendicular to the surface of the substrate.

Consequently, the above-mentioned technique was found as effective means in which the patterns of the piezoelectric/ electrostrictive member such as PZT having different crystallizations and formed on the buffer layer with orientation could easily be formed by patterning the oriented buffer layer, with the result that not only the stress acting at the interfaces of the above-mentioned laminated films could be relieved effectively but also the increase in the area and the efficiency in the formation of the structure could be enhanced greatly.

Figure 5B:
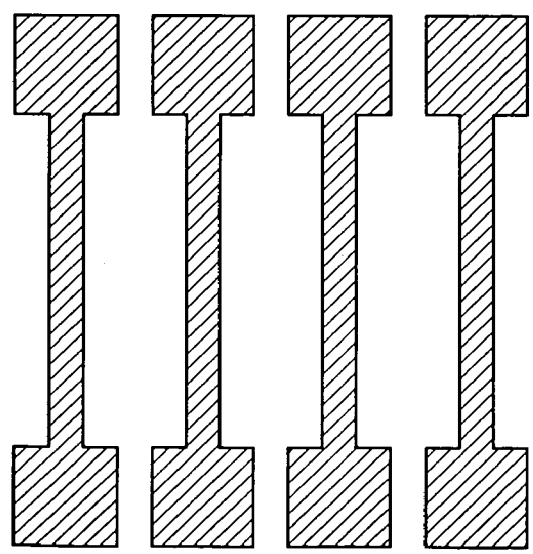

Here, the greater the difference in orientation degree between the portion having high crystallization formed on the buffer layer and the portion having low crystallization not used in the structure and removed by the etching, the more preferable for the etching. Similarly, in order to solve the problem regarding the peeling at the interfaces between the laminated films due to the increase in the area, in the spattering apparatus, after a mask pattern having a pattern of 100 μm☐ as shown in FIG. 5B was formed on a (111) monocrystal Si substrate, under an ordinary temperature condition, a Ti layer having a thickness of 50 nm was film-formed as an orientation preventing layer. Then, after the mask was removed, the temperature of the substrate was increased to 800° C., and YSZ having a thickness of 100 nm was film-formed as a buffer layer to cover the patterned Ti layer. In this case, an YSZ layer with (100) orientation was formed on a portion of the surface of the Si substrate having no Ti layer. Then, the temperature of the substrate is lowered to 600° C., and, and a Pt electrode having (100) orientation and having a thickness of 100 nm was film-formed on the buffer layer continuously. Then, the temperature of the substrate was increased to 650° C., and PZT having a thickness of 3000 nm was film-formed on the electrode with (001) oriented growth. As a result, it was found that the films could be formed on the large area without the peeling, as desired. By evaluating such crystallizations by means of the above-mentioned measurement, it was found that the Pt electrode and PZT film, on the Ti layer patterned as the orientation preventing layer, exhibited crystallization in which (100) and (001) orientation degrees became 50% or less, respectively, and, on the other portions, all of the buffer layer, Pt electrode and PZT film exhibited crystallization having high orientation degrees. From this result, it can be considered that, since the buffer layer, Pt electrode and PZT film formed on the portion on which the orientation preventing layer is formed have low crystallizations, the stress acting at the interfaces between the Si substrate, buffer layer, Pt electrode and PZT film is decreased, so that the stress is dispersed in the whole substrate, with the result that the film formation on the large area can be achieved. In order to disperse the stress generated by film formation on the large area substrate, it is more preferable that portions of the orientation preventing layer to be patterned are uniformly dispersed and arranged with respect to the substrate.

Next, the metallic mask was placed on the PZT film so-formed and a Pt upper electrode having a thickness of 100 nm was formed in a confronting relationship to the portion on which the patterned orientation preventing layer was not formed. In order to evaluate only the PZT having the high orientation (in the X-ray diffraction, (001) orientation degree is 90%) of the laminated films so formed, by using mixture liquid including water: concentrated nitric acid: concentrated sulfuric acid=2:2:1 (volumetric ratio) as etching liquid for PZT, wet etching was performed on the portion of PZT having low crystallization. As a result, it was found that the etching was completed with the etching grade of 8 to 9 nm/min. In the inventors' investigations, it was found that the etching grade performed on the PZT having high orientation (in the X-ray diffraction, (001) orientation degree is 90%) formed on the buffer layer was low as less as 3 to 4 nm/min and, by separately forming the PZT films having different crystallizations on the substrate by patterning at least the orientation preventing layer, the etching grade for the portions not relating to the formation of the structure was enhanced remarkably, so that not only the etching time could be reduced greatly but also the configuration of the structure after the etching could be arranged substantially in perpendicular to the surface of the substrate.

Consequently, the above-mentioned technique was found as effective means in which the patterns of the piezoelectric/electrostrictive member such as PZT having different crystallizations and formed on the orientation preventing layer with orientation could easily be formed by patterning the orientation preventing layer, with the result that not only the stress acting at the interfaces of the above-mentioned laminated films could be relieved effectively but also the increase in the area and the efficiency in the formation of the structure could be enhanced greatly. Then, in order to solve the problem regarding the peeling at the interfaces between the laminated films due to the increase in the area, in the spattering apparatus, the temperature of a (111) monocrystal Si substrate was increased to 800° C., and YSZ having (111) orientation and having a thickness of 100 nm was formed as a buffer layer with oriented film formation. Then, after a metallic mask having a pattern of 100 μm☐ as shown in FIG. 5A was placed, the temperature of the substrate was lowered to 600° C., and a Pt electrode pattern having a thickness of 100 nm and having (100) orientation was film-formed. Then, after the metallic mask was removed, the temperature of the substrate was increased to 650° C., and PZT having a thickness of 3000 nm was film-formed on the electrode pattern. As a result, the film peeling was ascertained. By performing the above-mentioned evaluation of the crystallization, it was found that the PZT film, on the portion on which the Pt electrode layer was patterned, exhibited crystallization in which (001) orientation degree became 90%, which is more worse than the (001) orientation degree (92%) of the PZT film directly film-formed on the portion of the buffer layer on which the Pt electrode layer was not formed. It is considered that this is because the grading matching between the YSZ buffer layer and the PZT layer is better than the grading matching between the Pt layer oriented on the YSZ buffer layer and the PZT layer. From this result, it can be considered that, since both of the PZT film directly film-formed on the buffer layer and the PZT layer on the Pt electrode layer have high crystallizations, the stress acting at the respective interfaces is increased, with the result that the stress is not dispersed in the whole substrate, thereby generating the film peeling. Further, the above-mentioned metallic mask was placed on the film-formed PZT film again, and a Pt upper electrode having a thickness of 100 nm was formed in a confronting relationship to the patterned Pt electrode layer. In order to evaluate the oriented PZT film formed on the Pt electrode layer and the PZT film directly oriented on the buffer layer in the resulting laminated films, by using mixture liquid including water: concentrated nitric acid: concentrated sulfuric acid=2:2:1 (volumetric ratio) as etching liquid for PZT, wet etching was performed on the portion of PZT formed on the buffer layer. As a result, it was found that the etching was completed with the etching grade of 3 to 4 nm/min.

In the inventors' investigations, it was found that the etching grade performed on the PZT formed on the Pt electrode layer was equal to 3 to 4 nm/min and thus there was no difference between the etching grades. Thus, in the spattering apparatus, the temperature of a (111) monocrystal Si substrate was increased to 800° C., and YSZ having (111) orientation and having a thickness of 100 nm was formed as a buffer layer with oriented film formation. Then, after a metallic mask having a pattern of 100 μm☐ as shown in FIG. 5A was placed; the temperature of the substrate was lowered to 600° C., and an electrode pattern of SRO as perovskite oxide conductive material having (100) orientation and a thickness of 100 nm was film-formed, and then, after the metallic mask was similarly removed, the temperature of the substrate was increased to 650° C., and PZT having a thickness of 3000 nm was film-formed on the electrode pattern. As a result, it was found that the film peeling was less than the case using the Pt electrode. By performing evaluation of such crystallizations, it was found that the PZT film, on the portion on which the SRO electrode layer was formed, exhibited crystallization in which (001) orientation degree became 94%, which is better than the (001) orientation degree (92%) of the PZT film directly film-formed on the portion of the buffer layer on which the SRO electrode layer was not formed. It is considered that this is because the grading matching between the YSZ buffer layer and the PZT layer becomes better by interposing the SRO layer and the SRO layer relieves the stress acting at the interface between the SRO layer and the PZT layer to disperse the stress in the whole substrate, thereby reducing the film peeling. In order to disperse the stress due to the film formation on the large area substrate, it is more preferable that the electrode layer portion of the perovskite oxide conductive material is dispersed and disposed uniformly in a wide range with respect to the substrate. Then, the above-mentioned metallic mask was placed again on the PZT film so film-formed, and a Pt upper electrode having a thickness of 100 nm was formed in a confronting relationship to the patterned SRO electrode layer. In order to evaluate only the PZT film formed on the SRO electrode layer in the resulting laminated films, by using mixture liquid including water: concentrated nitric acid: concentrated sulfuric acid=2:2:1 (volumetric ratio) as etching liquid for PZT, wet etching was performed on the portion having low crystallization. As a result, it was found that the etching was completed with the etching grade of 3 to 4 nm/min, which is substantially the same as the etching grade for the PZT formed on the SRO electrode layer. However, since the PZT films having different crystallizations were formed on the substrate separately, the configuration of the structure after the etching could be arranged appropriately in perpendicular to the surface of the substrate.

Consequently, the above-mentioned technique was found as effective means in which the patterns of the piezoelectric/electrostrictive member such as PZT having different crystallizations and formed on the SRO electrode layer with orientation could easily be formed by patterning the SRO electrode layer as the oriented perovskite oxide conductive member, with the result that not only the stress acting at the interfaces of the above-mentioned laminated films could be relieved effectively but also the increase in the area and the workability in the formation of the structure could be enhanced greatly.

The monocrystal substrate used in the present invention may be made of Si, MgO, sapphire, diamond, gallium arsenide or the like, and, by performing the grading matching of the buffer layer and the electrode layer, the present invention is effective to these substrates. Further, also with respect to laminated substrate having monocrystal surfaces such as SOI (Si on Insulator), the present invention is effective. For example, in Si monocrystal substrates which have been mass-produced with actual results, all kinds of substrate orientations such as substrate orientations (100), (111), (110) and the like can be used. Here, although there is the possibility that $SiO_2$ exists on the surface of the substrate or in the interface between the buffer layer and the Si substrate, so long as a thickness thereof is smaller than 20 nm, there arises no problem, and it is preferable that the thickness is smaller than 10 nm.

Further, materials constituting the buffer layer used in the present invention may include stabilized zirconia such as the above-mentioned YSZ, fluorite oxide, perovskite oxide conductive material, metallic material and the like.

Although the fluorite oxides may, for example, include $AmO_2$, $CeO_2$, $CmO_2$, $K_2O$, $Li_2O$, $Na_2O$, $NpO_2$, $PaO_2$, $PuO_2$, $RbO_2$, $TbO_2$, $ThO_2$, $UO_2$ and $ZrO_2$, $CeO_2$ and $ZrO_2$ are preferable. The metallic materials may, for example, include Ni, Pt, Pb, Ir, Cu, Al, Ag, γ-Fe, $Ir_2O_3$, MgO, $MgAl_2O_4$ and the like, and Pt and Ir are preferable. The perovskite oxide conductive materials may be oxide of $(Sr_x, Ca_y, Ba_z) RuO_3$ (but, x+y+z=1) system, STO (strontium titanate) and oxide of $CNiO_3$ system (C is at least one element selected from La, Pr, Nd, Sm and Eu) and may include $LaMoO_3$, $LaCoO_3$, $LaCrO_3$, $LaAlO_3$, $LaSrCoO_3$, $LaCuO_3$, $LaSrMnO_3$, $CaLaMnO_3$, $LaCaRhO_3$, $LaSrRhO_3$, $LaBaRhO_3$ and the like. A thickness thereof is 5 nm to 300 nm and preferably 20 nm to 200 nm. In these buffer layers, the above-mentioned substrate orientations can appropriately be selected and various orientations such as (100), (111) and (110) can appropriately be selected by manufacturing methods, and, by forming a plurality layers, any grading matching between the buffer layer and the substrate, electrode layer or piezoelectric/electrostrictive member layer can be adopted, and, for example, by using a monocrystal oxide conductor having the above-mentioned perovskite structure, the buffer layer can also act as the lower electrode, thereby reducing the number of manufacturing steps. According to the measurement performed by a 4-end needle method using Loresta-GP (MCP-600) (manufactured by MITHUBISHI CHEMISTRY CO., Ltd.), it was found that oxides exhibiting conductivity of $1 \times 10^{-1}$ to $1 \times 10^{-5}$ W cm is preferable as the above-mentioned monocrystal oxide conductor.

In the upper and lower electrode materials used in the present invention, it is preferable that at least one of Pt, Ir, Pd, Rh, Au, Ag, Ru and monocrystal oxide conductor having the above-mentioned perovskite structure is included as a main component, and the electrode material can be constituted by one of these metals or alloy thereof, and a plurality of layers may be used. A film thickness thereof is 5 nm to 300 nm and preferably 20 nm to 200 nm. The material of the orientation preventing layer used in the present invention may be comprised of metal such as Ti, Pb, Rh, Au, Ag, Ru, Si or the like, metal oxide thereof or metal nitride such as silicon nitride. Further, the orientation preventing layer may be constituted by a layer formed by reforming the surface of the monocrystal substrate by electron beam drawing or ion driving (injecting). As ion utilized in the ion driving, many elements in the periodic table and, any element which varies crystallization of an ion driving portion of the monocrystal substrate used can be appropriately selected. A film thickness or layer thickness (driving depth) of the orientation preventing layer is 100 nm or less and preferably 30 nm or less since such thickness can merely achieve the function of the orientation preventing layer.

Means for patterning the buffer layer, orientation preventing layer and electrodes on the monocrystal substrate of the present invention may be as follows:

(1) A method in which a metallic mask having a desired pattern is placed on the monocrystal substrate and the buffer layer is formed by oriented or epitaxial growth performed by film forming means such as a spattering method;

(2) A method in which, after the buffer layer is film-formed substantially on the whole surface of the monocrystal substrate with oriented or epitaxial growth, a resist layer having a desired pattern is formed by a photolithography process and, then, dry etching such as ICP, a Riegger process, a Bosch process, ion milling or the like is performed or wet etching using acid or alkali such as fluoro-acid solution or potassium hydroxide solution is performed to form a pattern and, lastly, the resist layer is removed; or (3) A method in which the surface of the monocrystal substrate is reformed by electron beam drawing or ion driving.

Regarding the buffer layer, orientation preventing layer and electrode layer on the monocrystal substrate of the present invention, plural layers may be patterned.

For example, in a case where the lower electrode is also patterned on the patterned buffer layer of the present invention, the following method can be used:

(A) A method similar to the above method (1);
(B) A method similar to the above method (2); or
(C) A method in which, after the buffer layer is film-formed substantially on the whole surface of the monocrystal substrate with oriented or epitaxial growth, the lower electrode pattern is formed by a method similar to the above method (3), and the patterning is performed using the lower electrode pattern as a mask with the aid of the wet etching or the dry etching in such a manner that the patterns of the buffer layer and of the lower electrode become substantially the same.

Here, regarding the relationship between the patterns of the buffer layer and of the lower electrode, it is desirable that, in a portion other than lead portions of the lower electrode, at least one of widths thereof satisfies a relation "buffer layer≧lower electrode". That is to say, it is preferable that the buffer layer and the lower electrode are laminated in such a manner that ends of the lower electrode do not extend beyond ends of the buffer layer in an overhanging condition. The reason is that, since the crystallization of the piezoelectric/electrostrictive member layer formed on a portion of the lower electrode overhanging from the buffer layer is worse than the crystallization of the piezoelectric/electrostrictive member layer formed on a portion of the lower electrode laminated with the buffer layer, if the etching using the lower electrode as the mask is performed in an etching treatment which will be described later, the piezoelectric/electrostrictive member layer formed on the portion of the lower electrode overhanging from the buffer layer is apt to be subjected to over-etching, with the result that, since the piezoelectric/electrostrictive member layer becomes thinner than the electrode size to protrude the electrode in a penthouse fashion, short circuit may caused upon application of voltage. Further, if the etching is finished before the over-etching is generated, since the piezoelectric/electrostrictive member layer having bad crystallization remains at fringe portions of the electrode, the property of the element will be worsened.

The material for the ferroelectric member can be selected from the following materials, for example:
PZT $[Pb(Zr_xTi_{1-x})O_3]$,
PMN $[Pb(Mg_xNb_{1-x})O_3]$,
PNN $[Pb(Nb_xNi_{1-x})O_3]$,
PSN $[Pb(Sc_xNb_{1-x})O_3]$,
PZN $[Pb(Zn_xNb_{1-x})O_3]$,
PMN-PT $[(1-y) [Pb(Mg_xNb_{1-x})O_3]\text{-y} [PbTiO_3]]$,
PSN-PT $[(1-y) [Pb(Sc_xNb_{1-x})O_3]\text{-y} [PbTiO_3]]$ and
PZN-PT $[(1-y) [Pb(Zn_xNb_{1-x})O_3]\text{-y}[PbTio_3]]$.
Where, each of x and y is the number smaller than 1 and greater than 0. For example, in case of PMN, x is 0.2 to 0.5 and, in PSN, x is preferably 0.4 to 0.7. In PMN-PT-, y is 0.2 to 0.4 and, in PSN-PT, y is 0.35 to 0.5 and, in PZN-PT, y is preferably 0.03 to 0.35.

Such piezoelectric/electrostrictive member layer may be constructed by single composition or by a combination of two or more materials. Further, it may be constructed by composition obtained by doping a small amount of element into the main component. The piezoelectric/electrostrictive member material to which the present invention is applicable is not limited to the above-mentioned perovskite piezoelectric/electrostrictive member material, but well-known piezoelectric/electrostrictive member materials may also be used.

Next, examples of a concrete layer construction of an actuator portion in the liquid jet head to which the present invention is applied will be listed up. The layer construction is indicated as follows: upper electrode//(piezoelectric/electrostrictive member) film//lower electrode//buffer layer//substrate (vibrating plate) (here, //:relationship having epitaxial growth, /:relationship having no epitaxial growth). Namely, (piezoelectric/electrostrictive member) film//lower electrode shows the epitaxial growth.

Example 1 Pt/Ti/PZT(001)//SrRuO$_3$(100)///Si(110)
Example 2 Pt/Ti/PZT(001)//La—SrTiO$_3$(100)///Si(110)
Example 3 Pt/Ti/PZT(001)//Nb—SrTiO$_3$(100)///Si(110)
Example 4 Pt/Ti/PZT(001)//SrRuO$_3$(100)//LaNiO$_3$(100)//CeO$_2$(100)//YSZ(100)//Si(100)
Example 5 Pt/Ti/PZT(001)//SrRuO$_3$(100)//SiO$_2$/Si(110)
Example 6 Pt/Ti/PZT(001)//La—SrTiO$_3$(100)/SiO$_2$/Si (110)
Example 7 Pt/Ti/PZT(001)//Nb—SrTiO$_3$(100)/SiO$_2$/Si (110)
Example 8 Pt/Ti/PMN(001)//SrRuO$_3$(100)///Si(110)
Example 9 Pt/Ti/PMN(001)//La—SrTiO$_3$(100)///Si(110)
Example 10 Pt/Ti/PMN(001)//Nb—SrTiO$_3$(100)///Si(110)
Example 11 Pt/Ti/PMN(001)//SrRuO$_3$(100)/SiO$_2$/Si(110)
Example 12 Pt/Ti/PMN(001)//La—SrTiO$_3$(100)/SiO$_2$/Si (110)
Example 13 Pt/Ti/PMN(001)//Nb—SrTiO$_3$(100)/SiO$_2$/Si (110)
Example 14 Pt/Ti/PZT(100)/Pt(199)/YSZ(111)//Si(111)

In the above-mentioned concrete examples, although the piezoelectric/electrostrictive member films are shown by PZT and PMN, layer constructions obtained by appropriately changing them into the above PZN, PSN, PNN, PMN-PT, PSN-PT or PZN-PT may be used, and, further, compositions such as La doped PZT:PLZT $[(Pb, La) (Z, Ti)O_3]$ obtained by doping a small amount of element such as La into the main component may be used. The film thickness of the piezoelectric/electrostrictive member film is preferably 300 nm to 10000 nm and more preferably 500 nm to 5000 nm.

In the present invention, the film formation of the buffer layer on the monocrystal substrate, the film formation of the lower electrode on the buffer layer the film formation of the piezoelectric/electrostrictive member and the film formation of the upper electrode are performed by a spattering method, an MOCVD method, a sol-gel method, an MBE method, a hydrothermal synthesizing method or a deposition method.

The patterning of the upper electrode on the piezoelectric/electrostrictive member layer, which is performed at need, can be effected by a method similar to that for the lower electrode; however, it is not necessary that the upper electrode is formed with oriented or epitaxial growth similar to the lower electrode. However, since the upper electrode acts as a mask in the patterning of the piezoelectric/electrostrictive member layer which will be described hereinbelow, it is necessary that the upper electrode be opposed to the pattern of the lower electrode via the piezoelectric/electrostrictive member layer.

As the patterning method for the piezoelectric/electrostrictive member layer of the present invention, a method depending upon dry etching such as ICP, a Riegger process, a Bosch process, ion milling or the like, using the upper electrode or the lower electrode as the mask, or a method in which, after the resist pattern known in the art was formed, or, by directly utilizing the upper electrode or the lower electrode as the mask, wet etching using acid or alkali such as fluoro-acid solution or potassium hydroxide solution is performed can be used. Here, as mentioned above, since the present invention utilizes the etching grade based on the difference in crystallization between the portion of the buffer layer on which the pattern is formed and the portion of the same buffer layer which is to be removed, the wet etching is particularly effective. However, the patterning methods for the respective layers are not limited to the above-mentioned ones.

As mentioned above, by using the present invention, it is possible to provide an element which is generally used in the semiconductor process and in which miniaturization and the increase in area can be achieved and which has excellent endurance and excellent piezoelectric/electrostrictive property and a method for manufacturing such an element. Further, it is possible to provide a piezoelectric/electrostrictive element structure having excellent endurance and excellent piezoelectric/electrostrictive property, and an elongated liquid jet head having liquid discharge ports arranged with high density and having high stable reliability and a method for manufacturing such a liquid jet head.

Now, a liquid jet head (referred to as "printer head" hereinafter) using the piezoelectric/electrostrictive element structure according to the present invention will be fully explained with reference to the accompanying drawings.

First Embodiment

Figure 1A:
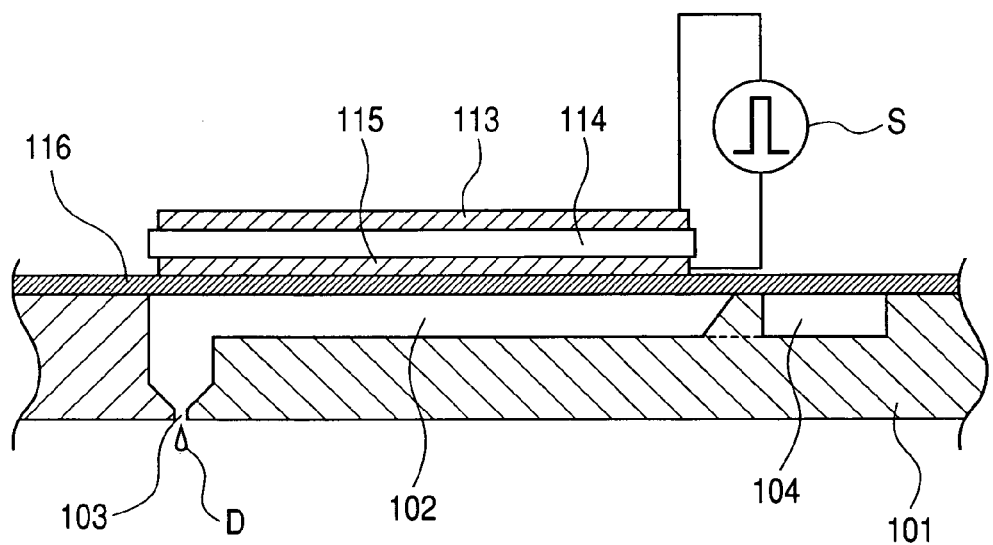
FIG. 1A is an enlarged sectional view of a printer head according to a first embodiment of the present invention.
Figure 1B:
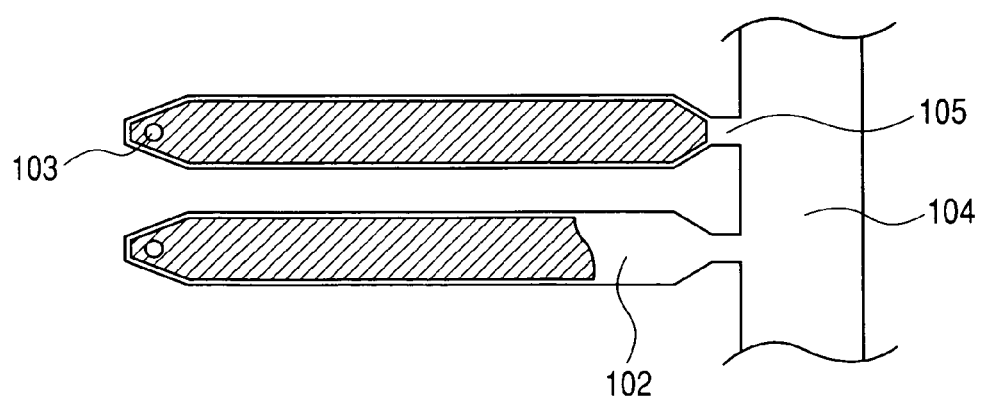
FIG. 1B is an enlarged view of a portion of FIG. 1A, when looked at from the above.

FIG. 1A is an enlarged sectional view of a printer head using the piezoelectric/electrostrictive element structure according to a first embodiment of the present invention, sectioned in parallel with a longitudinal direction of a vibrating plate 116, and FIG. 1B is a partial enlarged view of the printer head, viewed from the above. In the printer head, a substrate 101 comprised of a silicon substrate having a thickness of 200 μm is subjected to dry etching from upper and lower directions to form a plurality of recessed portions including discharge ports 103 arranged with pitch of 200 dpi, and plural liquid chambers 102 are formed by covering the recessed portions with vibrating plates 116 formed on the piezoelectric/electrostrictive element structure of the present invention, which will be described later, and by joining the vibrating plates 116 to the substrate 101. Each liquid chamber 102 is formed to have a width of 65 μm, a length of 3000 μm and a depth of 100 μm, and longitudinal front and rear ends of the liquid chamber are tapered and the rear end is communicated with a common liquid chamber 104. Further, a surface of each liquid chamber 102 opposed to a surface thereof covered by the vibrating plate 116 is provided with a discharge port 103 formed therein and having a diameter of 15 μm. Each vibrating plate 116 forms at least one surface of each liquid chamber 102 and is flexed by deformation of the piezoelectric/electrostrictive element. However, a portion of the vibrating plate directly fixed to the substrate 101 is not called the vibrating plate 116.

Figure 2A:
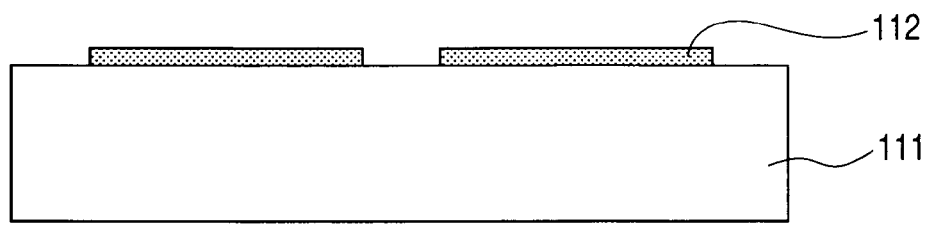
FIGS. 2A, 2B and 2C are sectional views showing manufacturing steps of the printer head according to the first embodiment of the present invention, looked at from an orientation direction of a discharge port.

Next, manufacturing steps for the piezoelectric/electrostrictive element structure of the present invention as described above will be fully explained with reference to FIG. 2A to FIG. 4B. FIG. 2A to FIG. 4B are views for mainly explaining the manufacturing steps for the piezoelectric/electrostrictive element structure of the present invention in manufacturing steps for the printer head and are sectional views, looked at from a direction perpendicular to an arrangement pitch of the discharge ports 103. First of all, as shown in FIG. 2A, a metallic mask for a buffer layer, on which patterns corresponding to the plural respective liquid chambers 102 shown in FIG. 1B is formed, is placed on a (111) monocrystal Si substrate 111 having a size of 6 inches, and YSZ which is monocrystal oxide material as a buffer layer 112 is subjected to epitaxial growth by a spattering process, while heating the monocrystal Si substrate 111 to 800° C., thereby patterning a YSZ film having a thickness of 100 nm and (111) orientation.

Figure 2B:
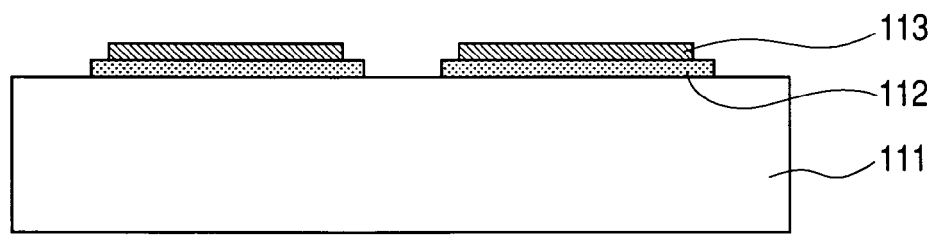

Then, after the metallic mask for the buffer layer is removed, a metallic mask for a lower electrode, which has a pattern including a pattern substantially the same as the pattern of the buffer layer and electrode leading patterns (not shown), is placed on the patterned YSZ buffer layer 112, and an SRO lower electrode 113 subjected to epitaxial growth as shown in FIG. 2B is formed with patterning, while heating the monocrystal Si substrate to 600° C.

Figure 2C:
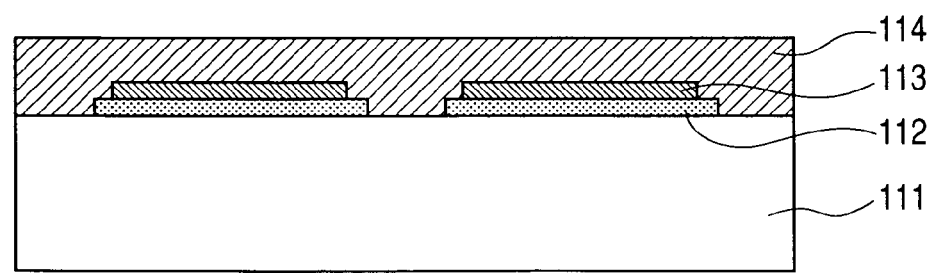
Figure 3A:
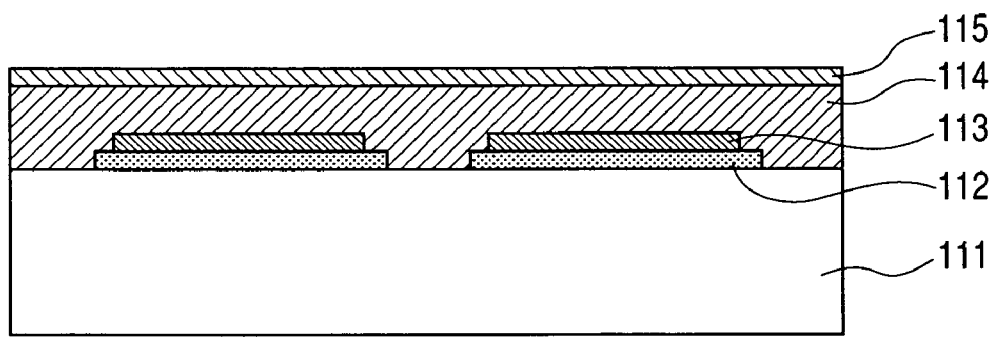
FIGS. 3A and 3B are sectional views showing the manufacturing steps of the printer head according to the first embodiment of the present invention, looked at from the orientation direction of the discharge port.

Then, after the metallic mask for the lower electrode is removed, as shown in FIG. 2C, PZT as a piezoelectric/electrostrictive member layer is film-formed on the lower electrode by a spattering process at the substrate temperature of 650° C. In the positions where the buffer layer 112 and the lower electrode 113 were patterned, the epitaxial growth was generated, with the result that a (001) PZT film 114 having a thickness of 3000 nm was film-formed. Further, in the area where the buffer layer 112 was not patterned, a polycrystal film was generated. Then, as shown in FIG. 3A, a Pt upper electrode 115 having a thickness of 150 nm and having Ti (4 nm) as an underground layer is film-formed on the PZT layer 114 by a spattering process. In the illustrated embodiment, while the upper electrode 115 was used as a common electrode so that the upper electrode 115 can also act as an etching stopping layer, if the upper electrode is a separate electrode, thereafter, it is necessary to form an $SiO_2$ layer having an insulating property as an etching stopping layer.

Figure 3B:
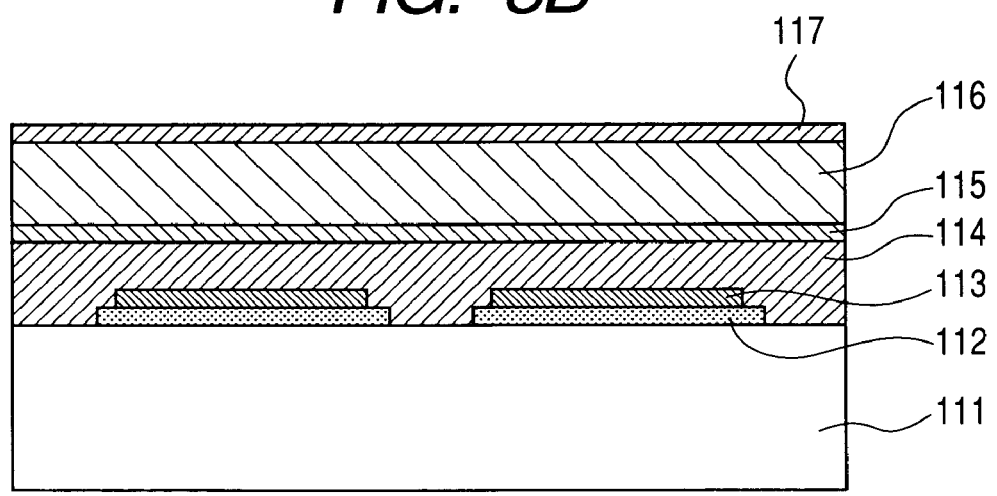
Figure 4A:
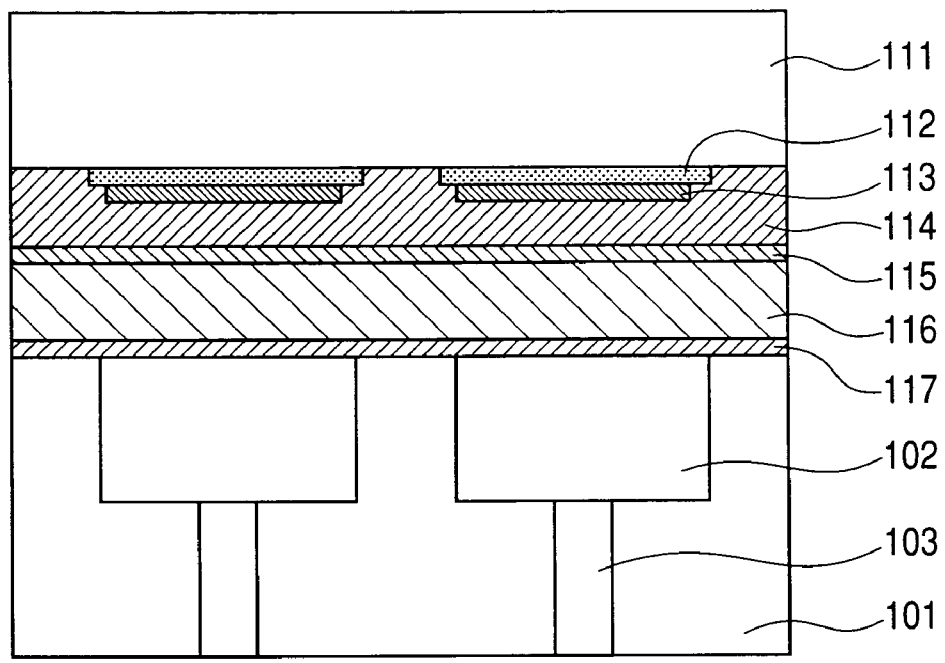
FIGS. 4A and 4B are sectional views showing the manufacturing steps of the printer head according to the first embodiment of the present invention, looked at from the orientation direction of the discharge port.
Figure 4B:
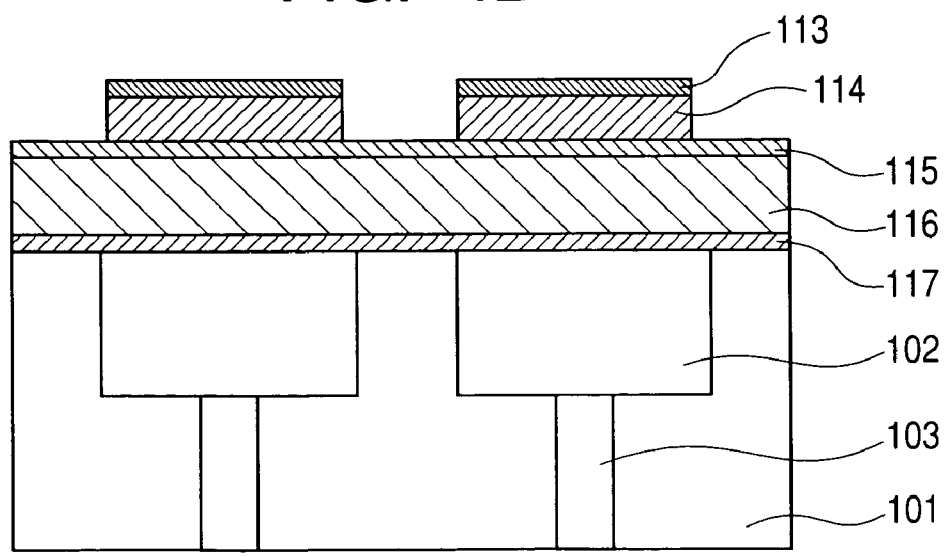

Then, as shown in FIG. 3B, $SiO_2$ as vibrating plate material is film-formed with a thickness of 3000 nm by a spattering method to form the vibrating plate 116, and an Au layer 117 (100 nm) for Au—Au joining with respect to the substrate 101 is provided on the vibrating plate. It is desirable that the material of the vibrating plate 116 is constructed by, for example, a film layer, having a thickness of 1 to 30 μm and preferably 1 to 15 μm, of zirconia, silicon, chrome, stainless steel, silicon oxide or silicon nitride as ceramic material or metallic material or metal oxide material nitrogen oxide material which can be deformed elastically by electrostriction of the piezoelectric/electrostrictive member film 114. As shown in FIG. 4A, the ferroelectric member element structure so formed is aligned with the substrate 101 having the respective liquid chambers 102, discharge ports 103 and common liquid chamber 104 formed therein and is joined to the substrate by the Au—Au joining. Here, the joining between the substrate 101 and the vibrating plate 116 may be achieved by anode joining, eutectic joining, adhesive joining or the like, as well as the Au—Au joining described in the illustrated embodiment.

Then, after resist is formed at a desired position in order to protect the parts to be left such as the substrate 101 and the like, the wet etching using fluoro-acid solution is performed to remove predetermined portions of the monocrystal substrate 111 and the piezoelectric/electrostrictive member layer 114, and then, the resist is removed to complete the printer head. In this wet etching treatment, the etching grade for the piezoelectric/electrostrictive member layer 114 was 120 nm/min and the configuration of the piezoelectric/electrostrictive member layer 114 after the etching was arranged substantially perpendicular to the surface of the substrate.

Then, discharging tests of the printer head having the above-mentioned construction were performed. The discharging principle of this printer head is such that ink supplied from an ink cartridge (not shown in FIG. 1A) in the common liquid chamber 104 is loaded into the respective liquid chambers 102 through the tapered portions 105 and, by applying a signal from any drive source S to the upper and lower electrodes 113 and 115, the vibrating plate 116 is vibrated to change the volume of the liquid chamber 102, thereby pressurizing the ink contained in the liquid chamber 102 to discharge an ink droplet D from the discharge port 103. In the printer head according to the illustrated embodiment, it was found that the ink droplet having a discharging amount of 9 pl and a discharging speed of 9 msec can be obtained by applying a sine wave of 20 V and 10 kHz, and there is no problem and an excellent printer head is provided.

Comparative Example

FIG. 6A to FIG. 8B are views for mainly explaining the manufacturing method of the piezoelectric/electrostrictive element structure of the present invention in the manufacturing process of the printer head and are sectional views looked at from a direction perpendicular to the arrangement pitch of the discharge ports 103. Here, the construction of the printer head is similar to the first embodiment.

Figure 6A:
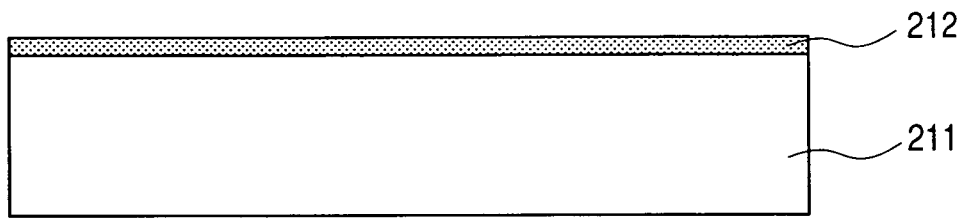
FIGS. 6A, 6B and 6C are sectional views showing manufacturing steps in a comparative example, looked at from an orientation direction of a discharge port.
Figure 6B:
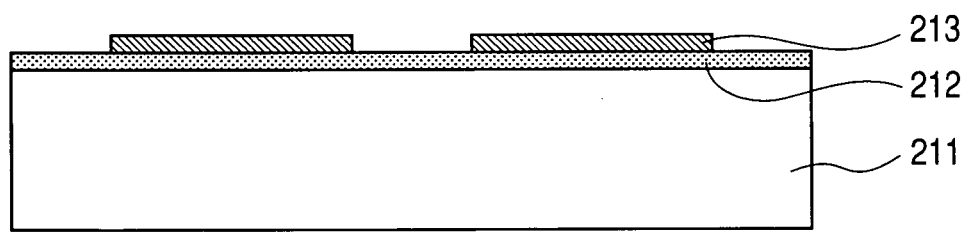
Figure 6C:
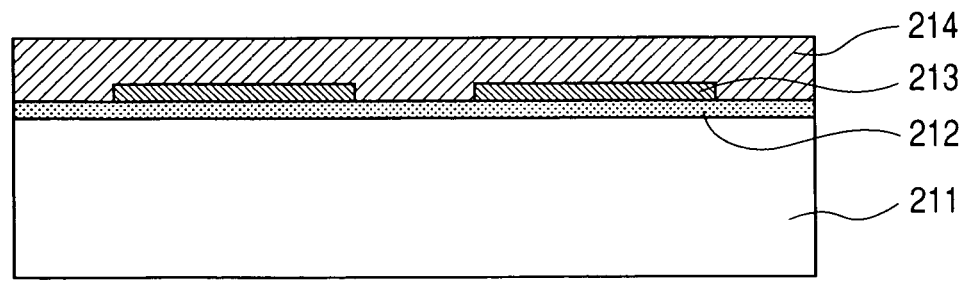

First of all, as shown in FIG. 6A, YSZ which is monocrystal oxide material as a buffer layer 212 is subjected to epitaxial growth by a spattering process, while heating a (111) monocrystal Si substrate 211 having a size of 6 inches to 850° C., thereby film-forming a YSZ film having a thickness of 100 nm and (111) orientation. Then, as shown in FIG. 6B, a metallic mask for a lower electrode is placed on the YSZ buffer layer 212, and Pt as a lower electrode 213 is subjected to epitaxial growth by a spattering process, while heating it to 600° C., thereby patterning a Pt lower electrode 213 having a thickness of 100 nm and (100) orientation. Then, after the metallic mask for the lower electrode is removed, as shown in FIG. 6C, PZT as a piezoelectric/electrostrictive member is film-formed on the lower electrode by a spattering process at the substrate temperature of 650° C. The epitaxial growth was generated on the buffer layer 212, with the result that a (001) PZT film 214 having a thickness of 3000 nm was film-formed. However, curve in the substrate 211 including laminated films was ascertained.

Figure 7A:
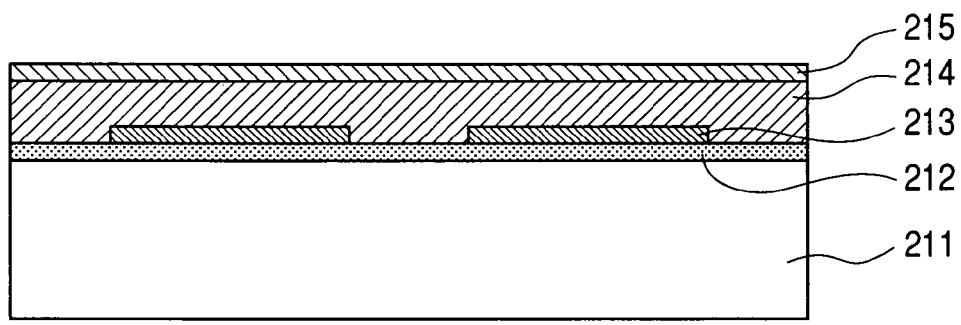
FIGS. 7A and 7B are sectional views showing the manufacturing steps in the comparative example, looked at from then orientation direction of the discharge port.
Figure 7B:
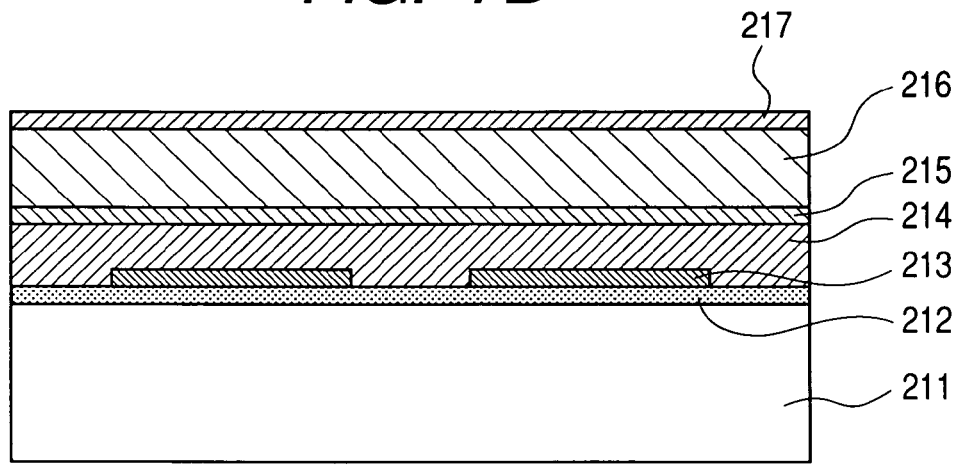
Figure 8A:
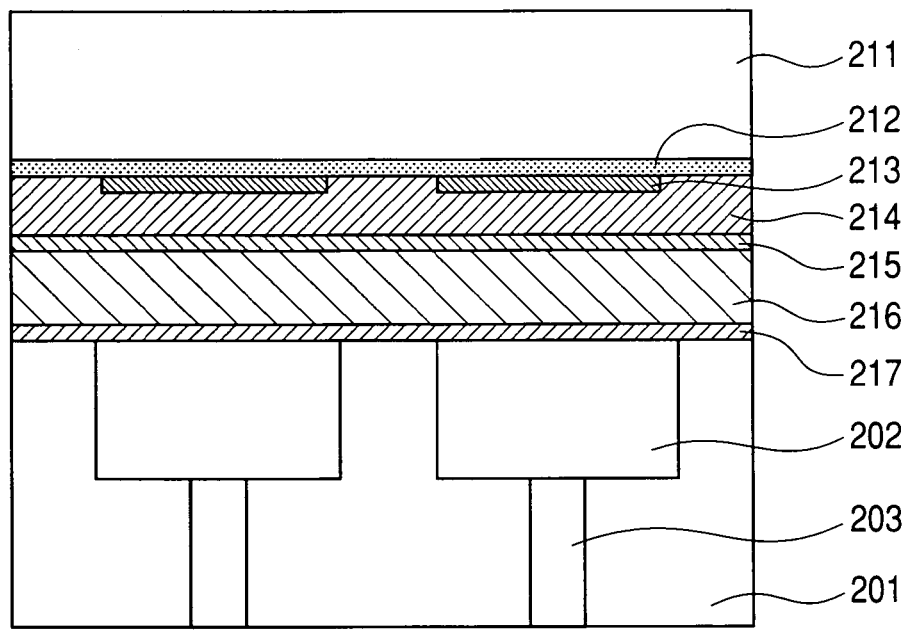
FIGS. 8A and 8B are sectional views showing the manufacturing steps in the comparative example, looked at from then orientation direction of the discharge port.
Figure 8B:
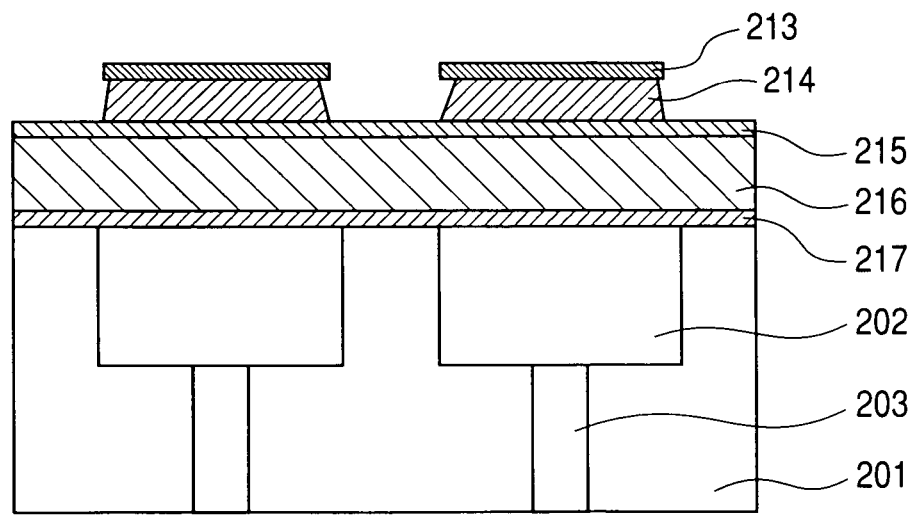

Then, as shown in FIG. 7A, a Pt upper electrode 215 having a thickness of 150 nm and having Ti (4 nm) as an underground layer was film-formed on the PZT layer 114 by a spattering process. Then, as shown in FIG. 7B, $SiO_2$ as a material of the vibrating plate is film-formed with a thickness of 3000 nm by a spattering process to form a vibrating plate 216, and an Au layer 217 (film thickness: 100 nm) for Au—Au joining to the substrate 201 is provided on the vibrating plate. As shown in FIG. 8A, the piezoelectric/electrostrictive member element structure so formed was aligned with the substrate 201 having respective liquid chambers 202, discharge ports 203 and common liquid chamber 204 and was tried to be joined to the substrate by the Au—Au joining. However, the structure could not be joined to the substrate due to the presence of the curve of the substrate. Thus, the substrate was heated in order to correct the curve, and then, after the correction, the structure was joined to the substrate 201 by an adhesive.

Then, after resist is formed at a desired position in order to protect the substrate 201 and the like, the wet etching using fluoro-acid solution is performed to remove the monocrystal substrate 211, buffer layer 213 and ferroelectric member layer 214, and then, the resist is peeled to complete the printer head. In this wet etching treatment, the etching grade for the piezoelectric/electrostrictive member layer 214 was 70 nm/min and the configuration of the ferroelectric member layer 214 after the etching was deformed due to partial over-etching, with the result that the desired result could not be achieved.

Then, discharging tests of the printer head having the above-mentioned construction were performed. Similar to the first embodiment, when a sine wave of 20 V and 10 kHz was applied, a discharging amount of 10 pl and a discharging speed of 9 msec could be obtained partially, but, some discharge ports did not discharge the ink at all. Further, when the endurance test was continued, some discharge ports failed to discharge the ink.

Second Embodiment

FIG. 9A to FIG. 10C are views for mainly explaining the manufacturing method of a piezoelectric/electrostrictive element structure according to a second embodiment of the present invention in the manufacturing process of the printer head and are sectional views looked at from a direction perpendicular to the arrangement pitch of the discharge ports 103. Here, the construction of the printer head is similar to the first embodiment. The printer head according to this embodiment was manufactured by using SOI-Epi wafer/ELTRAN (manufactured by Canon) 320 having a thickness of about 500 μm. In this ELTRAN, an $SiO_2$ layer 322 and a monocrystal Si layer 323 are formed on an Si layer 321, wherein the Si layer 321 fills the fundamental role of forming respective liquid chambers, the $SiO_2$ layer 322 acts as an etching stopping layer and a vibrating plate and the monocrystal Si layer 323 acts as a monocrystal substrate used in the manufacture of a ferroelectric member structure. The ELTRAN according to the illustrated embodiment has a three-layer construction in which the Si layer 321 has a thickness of 500 μm, the $SiO_2$ layer 322 has a thickness of 3 μm and the (111) monocrystal Si layer 323 has a thickness of 0.3 μm.

Figure 9A:
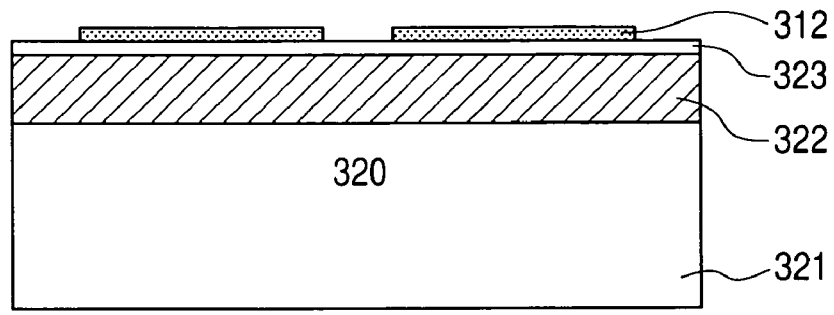
FIGS. 9A, 9B and 9C are sectional views showing manufacturing steps of a printer head according to a second embodiment of the present invention, looked at from an orientation direction of a discharge port.
Figure 9B:
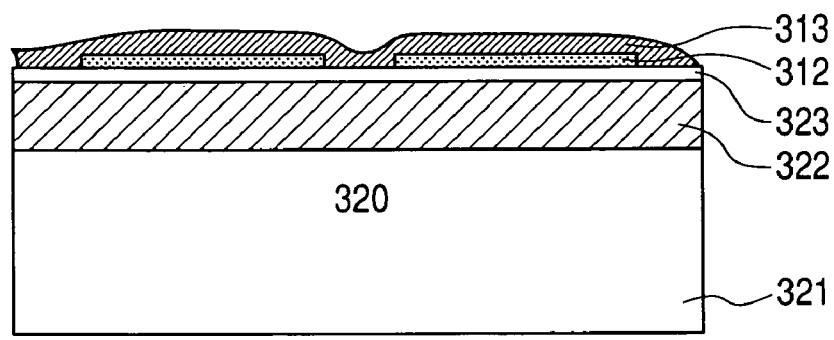
Figure 9C:
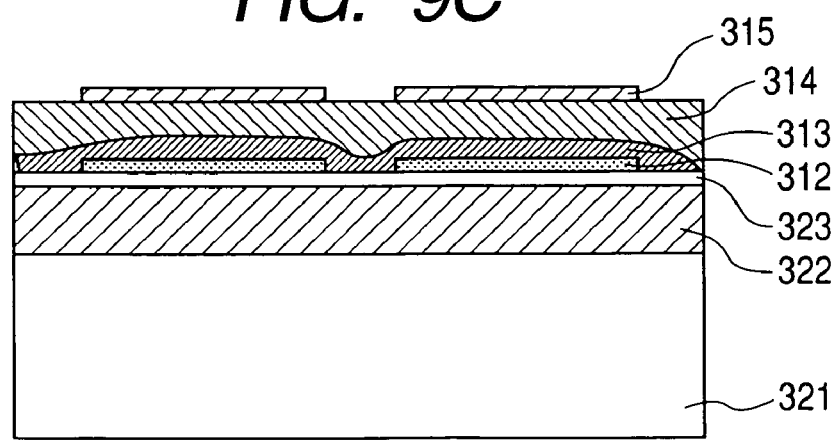

Next, manufacturing steps for the piezoelectric/electrostrictive element structure of the present invention as described above will be fully explained with reference to FIG. 9A to FIG. 10C. FIG. 9A to FIG. 10C are views for mainly explaining the manufacturing steps for the piezoelectric/electrostrictive element structure of the present invention in manufacturing steps for the printer head and are sectional views, looked at from a direction perpendicular to an arrangement pitch of the discharge ports 103. First of all, as shown in FIG. 9A, a metallic mask for a buffer layer, on which patterns corresponding to the plural respective liquid chambers 102 shown in FIG. 1B are formed, is placed on the above-mentioned ELTRAN substrate 320 having a size of 6 inches, and YSZ which is monocrystal oxide material as a buffer layer 312 is subjected to epitaxial growth by a spattering process, while heating the substrate to 850° C., thereby patterning a YSZ film having a thickness of 100 nm and (111) orientation. Then, after the metallic mask for the buffer layer is removed, as shown in FIG. 9B, Pt as a lower electrode 313 is subjected to epitaxial growth by a spattering process on the patterned YSZ buffer layer 312, while heating the substrate to 600° C., thereby film-forming a Pt lower electrode 313 having a thickness of 100 nm and (100) orientation. Then, as shown in FIG. 9C, PZT which is a piezoelectric/electrostrictive member was film-formed on the lower electrode by a spattering process, while heating the substrate to 650° C. Here, in the positions where the buffer layer 312 was patterned, the epitaxial growth was generated in the PZT layer, with the result that a (001) PZT film 314 having a thickness of 3000 nm was film-formed. Further, in the area where the buffer layer 312 was not patterned, a polycrystal film was generated. Then, a Pt upper electrode 315 having a thickness of 150 nm and having Ti (4 nm) as an underground layer was patterned and film-formed at positions corresponding to the respective liquid chambers on the PZT layer 314 by a spattering process.

Figure 10A:
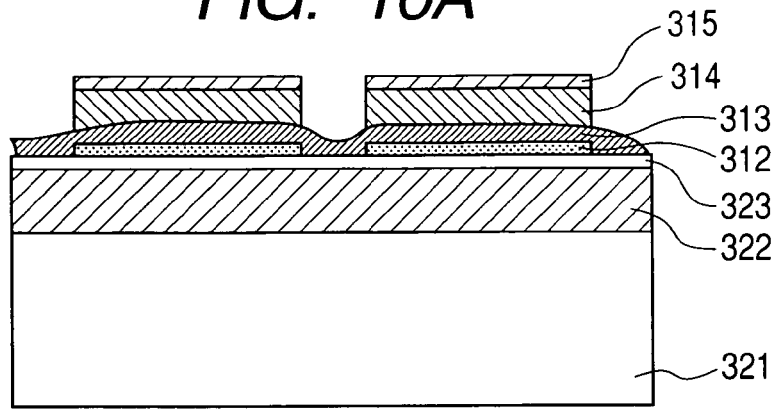
FIGS. 10A, 10B and 10C are sectional views showing the manufacturing steps of the printer head according to the second embodiment of the present invention, looked at from the orientation direction of the discharge port.
Figure 10B:
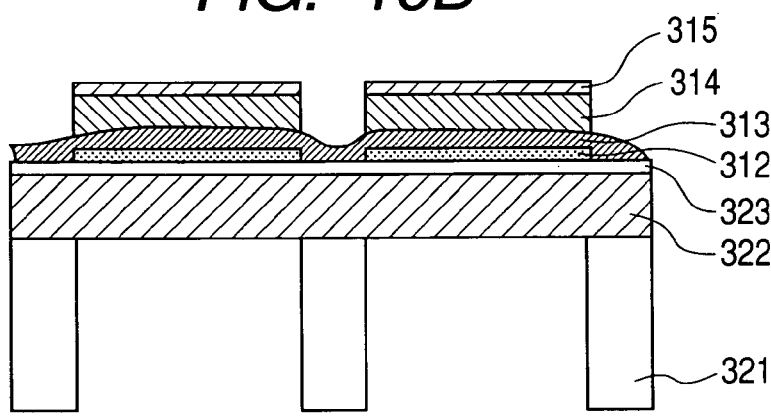
Figure 10C:
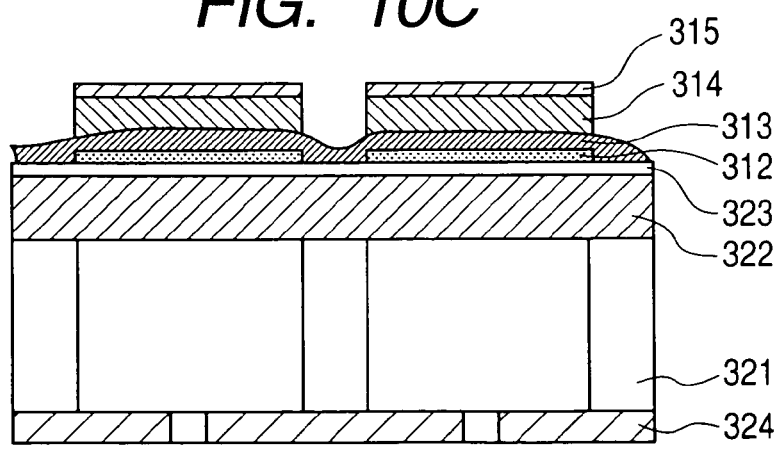

Then, as shown in FIG. 10A, useless portions of the PZT layer 314 are removed by the wet etching using fluoro-acid solution. In this case, the Pt lower electrode 313 acts as an etching stopping layer. Then, as shown in FIG. 10B, the Si layer of ELTRAN is subjected to the wet etching using fluoro-acid solution to form the respective liquid chambers and the common liquid chamber. In this process, an $SiO_2$ layer 322 acts as an etching stopping layer and also acts as a vibrating plate. Lastly, a nozzle plate which is a SUS substrate having a plurality of discharge ports formed therein is joined by an adhesive, thereby completing the printer head of the present invention.

In this wet etching treatment, the etching grade was 120 nm/min and the configuration of the PZT layer 314 after the etching was arranged substantially perpendicular to the surface of the substrate, as desired.

Then, discharging tests of the printer head having the above-mentioned construction were performed. In the printer head according to the illustrated embodiment, it was found that a discharging amount of 10 pl and a discharging speed of 9 msec can be obtained by applying a sine wave of 20 V and 10 kHz, and there is no problem and an excellent printer head is provided.

Third Embodiment

Figure 11A:
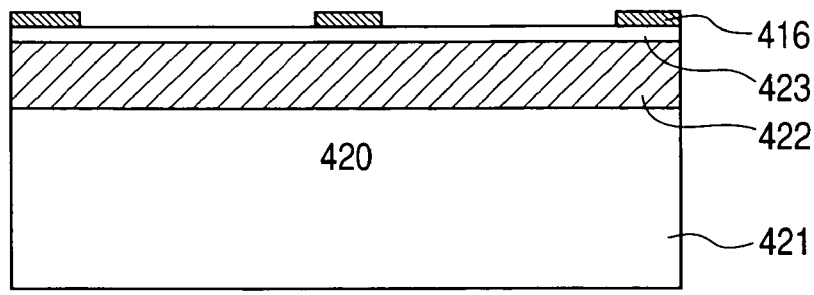
FIGS. 11A, 11B and 11C are sectional views showing manufacturing steps of a printer head according to a third embodiment of the present invention, looked at from an orientation direction of a discharge port.
Figure 11B:
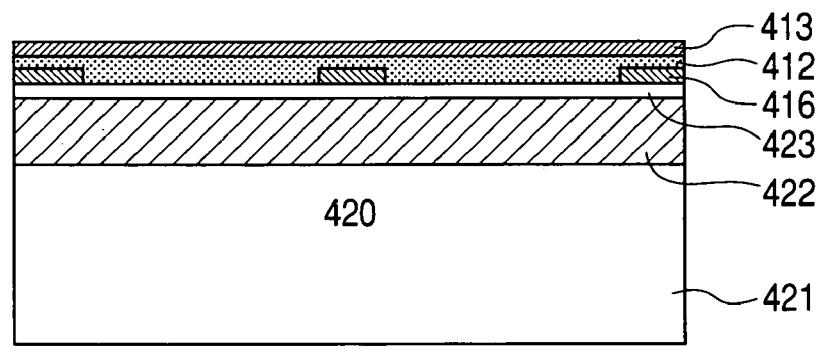
Figure 11C:
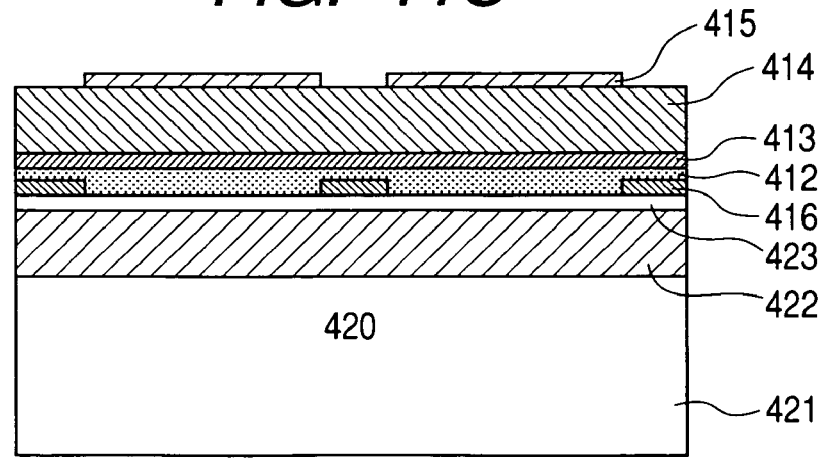

FIG. 11A to FIG. 12C are views for mainly explaining the manufacturing method of a piezoelectric/electrostrictive element structure according to a third embodiment of the present invention in the manufacturing process of the printer head and are sectional views looked at from a direction perpendicular to the arrangement pitch of the discharge ports. Here, the construction of the printer head is similar to the first embodiment. The printer head according to this embodiment was manufactured by using SOI-Epi wafer/ELTRAN (manufactured by Canon) 420 having a thickness of about 500 μm. In this ELTRAN, an $SiO_2$ layer 422 and a monocrystal Si layer 423 are formed on an Si layer 421, wherein the Si layer 421 fills the fundamental role of forming respective liquid chambers, the $SiO_2$ layer 422 acts as an etching stopping layer and a vibrating plate and the monocrystal Si layer 423 acts as a monocrystal substrate used in the manufacture of a piezoelectric/electrostrictive element structure. The ELTRAN according to the illustrated embodiment has a three-layer construction in which the Si layer 421 has a thickness of 500 μm, the $SiO_2$ layer 422 has a thickness of 3 μm and the (111) monocrystal Si layer 423 has a thickness of 0.3 μm. First of all, as shown in FIG. 11A, a metallic mask having patterns formed to substantially conceal the plural respective liquid chambers 102 shown in FIG. 1B is placed on the above-mentioned ELTRAN substrate 420 having a size of 6 inches, and Ti having a thickness of 50 nm is film-formed as an orientation preventing layer 416. Then, as shown in FIG. 11B, YSZ which is monocrystal oxide material as a buffer layer 412 is film-formed to cover the patterned orientation preventing layer 416 by a spattering process, while heating the substrate to 850° C., and then, Pt having a thickness of 100 nm as a lower electrode 413 is film-formed on the YSZ buffer layer 412 by a spattering process, while heating the substrate to 600° C. In this case, at areas other than the patterned orientation preventing layer 416, the YSZ and Pt are subjected to epitaxial growth with (111) and (100), respectively, and the YSZ and Pt formed on the orientation preventing layer 416 are not subjected to epitaxial growth. Then, as shown in FIG. 11C, PZT which is a piezoelectric/electrostrictive member was film-formed on the lower electrode by a spattering process, while heating the substrate to 650° C. Here, on the epitaxial-grown Pt, the PZT layer was subjected to epitaxial growth, thereby film-forming a (001) PZT film 414 having a thickness of 3000 nm. Similarly, in an area where the Pt was not subjected to the epitaxial growth, the PZT was also not subjected to the epitaxial growth. Then, a Pt upper electrode 415 having a thickness of 150 nm and having Ti (4 nm) as an underground layer was patterned and film-formed at positions corresponding to the respective liquid chambers on the PZT layer 414 by a spattering process.

Figure 12A:
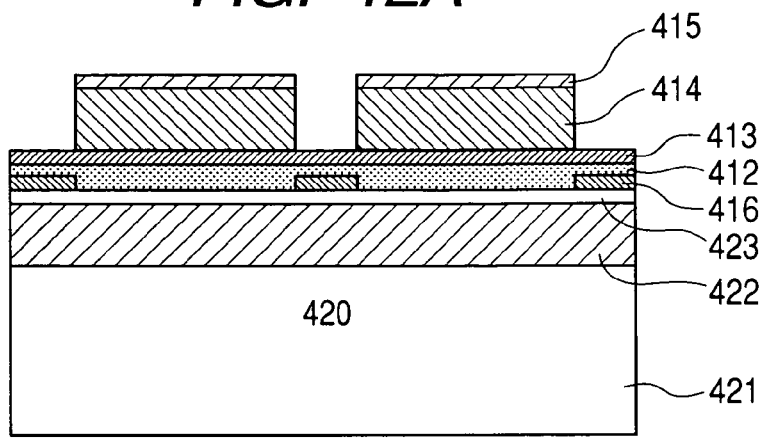
FIGS. 12A, 12B and 12C are sectional views showing the manufacturing steps of the printer head according to the third embodiment of the present invention, looked at from the orientation direction of the discharge port.
Figure 12B:
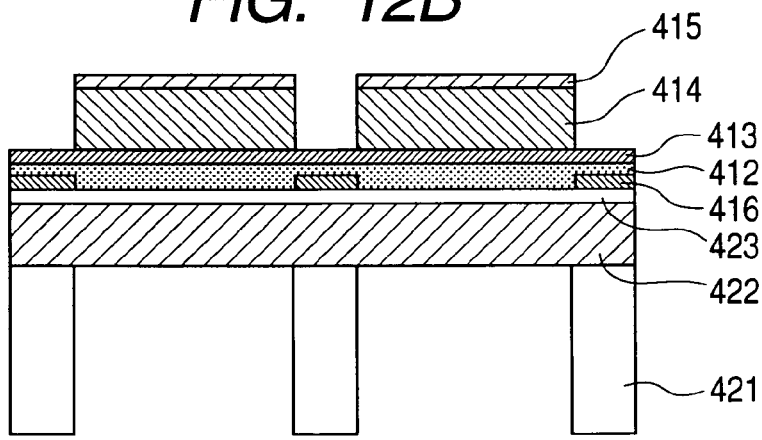
Figure 12C:
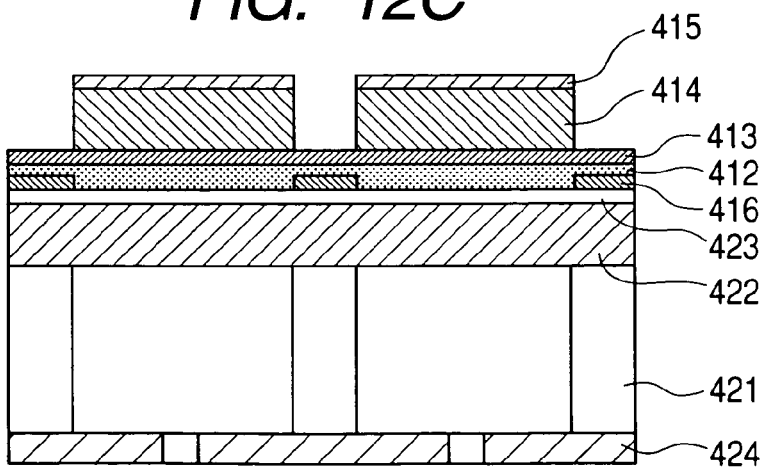

Then, as shown in FIG. 12A, useless portions of the PZT layer 414 are removed by the wet etching using fluoro-acid solution. In this case, the Pt lower electrode 413 acts as an etching stopping layer. Then, as shown in FIG. 12B, the Si layer of ELTRAN is subjected to the wet etching using fluoro-acid solution to form the respective liquid chambers and the common liquid chamber. In this process, an $SiO_2$ layer 422 acts as an etching stopping layer and also acts as a vibrating plate. Lastly, a nozzle plate 424 which is a SUS substrate having a plurality of discharge ports formed therein is joined by an adhesive, thereby completing the printer head of the present invention.

In this wet etching treatment, the etching grade was 150 nm/min and the configuration of the PZT layer 414 after the etching was arranged substantially perpendicular to the surface of the substrate, as desired.

Then, discharging tests of the printer head having the above-mentioned construction were performed. In the printer head according to the illustrated embodiment, it was found that a discharging amount of 10 pl and a discharging speed of 9 msec can be obtained by applying a sine wave of 20 V and 10 kHz, and there is no problem and an excellent printer head is provided.

Fourth Embodiment

Figure 13A:
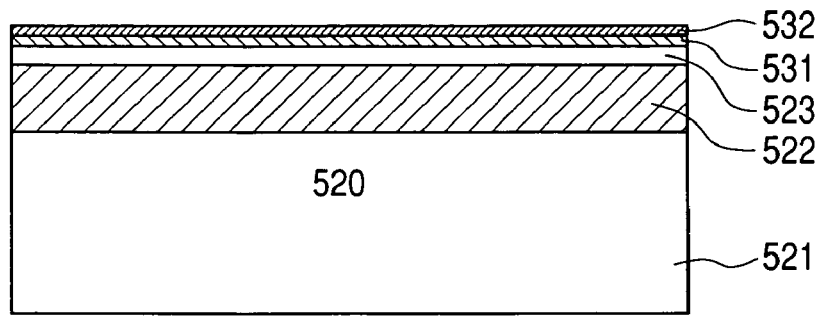
FIGS. 13A, 13B and 13C are sectional views showing manufacturing steps of a printer head according to a fourth embodiment of the present invention, looked at from an orientation direction of a discharge port.
Figure 13B:
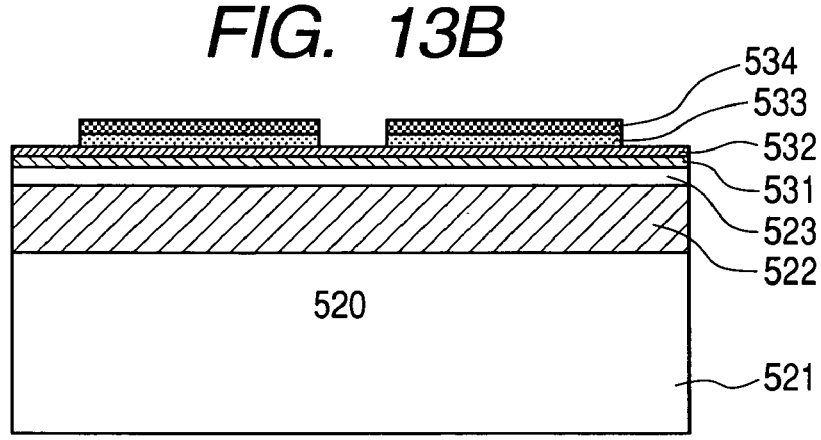
Figure 13C:
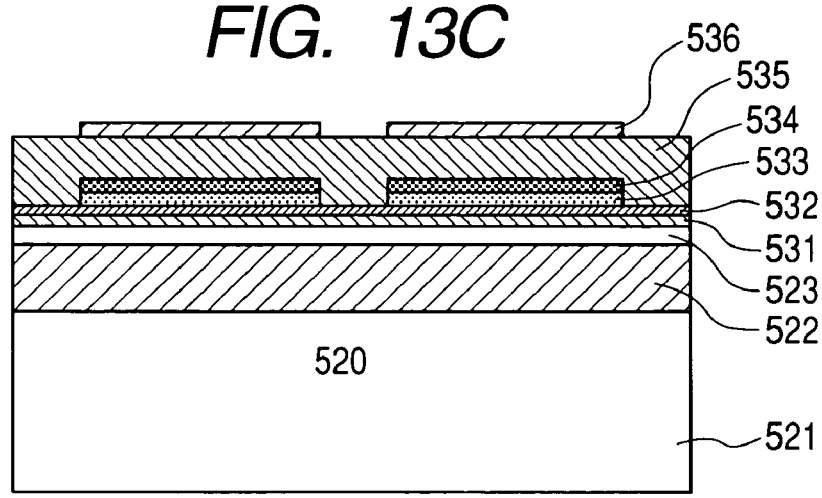

FIG. 13A to FIG. 14C are views for mainly explaining the manufacturing method of a piezoelectric/electrostrictive element structure according to a fourth embodiment of the present invention in the manufacturing process of the printer head and are sectional views looked at from a direction perpendicular to the arrangement pitch of the discharge ports. Here, the construction of the printer head is similar to the first embodiment. The printer head according to this embodiment was manufactured by using SOI-Epi wafer/ELTRAN (manufactured by Canon) 520 having a thickness of about 500 μm. In this ELTRAN, an $SiO_2$ layer 522 and a monocrystal Si layer 523 are formed on an Si layer 521, wherein the Si layer 521 fills the fundamental role of forming respective liquid chambers, the $SiO_2$ layer 522 acts as an etching stopping layer and a vibrating plate and the monocrystal Si layer 523 acts as a monocrystal substrate used in the manufacture of a piezoelectric/electrostrictive element structure. The ELTRAN according to the illustrated embodiment has a three-layer construction in which the Si layer 521 has a thickness of 500 μm, the $SiO_2$ layer 522 has a thickness of 3 μm and the (111) monocrystal Si layer 523 has a thickness of 0.3 μm. First of all, as shown in FIG. 13A, YSZ and $CeO_2$ which are monocrystal oxide materials as a buffer layer 512 are subjected to epitaxial growth successively by a spattering process on the above-mentioned ELTRAN substrate 520 having a size of 6 inches, while heating the substrate to 850° C., thereby film-forming a YSZ layer and a $CeO_2$ layer 532 having thicknesses of 100 nm and 5 nm and (100) orientations, respectively. Then, a metallic mask for a lower electrode, having patterns corresponding to the plural respective liquid chambers 102 shown in FIG. 1B is placed, and, as shown in FIG. 13B, $LaNiO_3$ and $SrRuO_3$ which are perovskite monocrystal oxide conductors as a lower electrode are film-formed successively, while heating the substrate to 600° C., thereby forming a patterned (100) $LaNiO_3$ layer 533 and a patterned (100) $SrRuO_3$ layer 534. Then, as shown in FIG. 13C, a PZT film 535 as a piezoelectric/electrostrictive member having a thickness of 3000 nm was film-formed on the $SrRuO_3$ layer by a spattering process, while heating the substrate to 650° C. Here, on the patterned (100) $LaNiO_3$ layer 533 and (100) $SrRuO_3$ layer 534, the PZT layer 535 was subjected to epitaxial growth. Further, at areas other than the electrode area, the crystallization is lower than the electrode area. Then, a Pt upper electrode 536 having a thickness of 150 nm and having Ti (4 nm) as an underground layer was patterned and film-formed at positions corresponding to the respective liquid chambers on the PZT layer 535 by a spattering process.

Figure 14A:
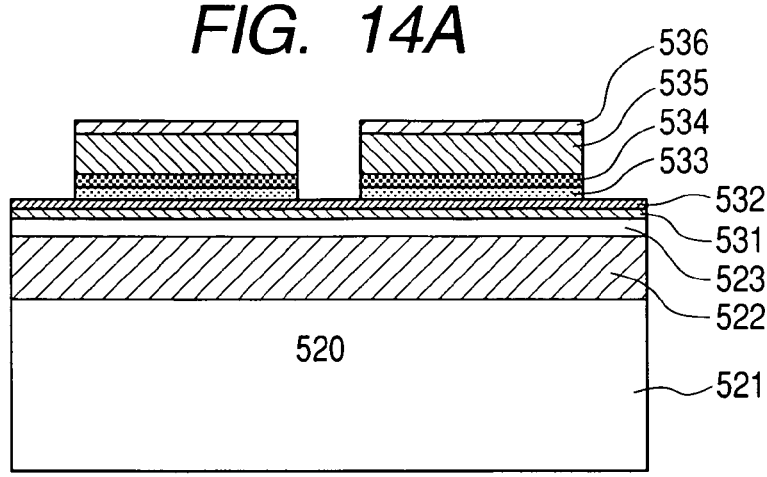
FIGS. 14A, 14B and 14C are sectional views showing the manufacturing steps of the printer head according to the fourth embodiment of the present invention, looked at from the orientation direction of the discharge port.
Figure 14B:
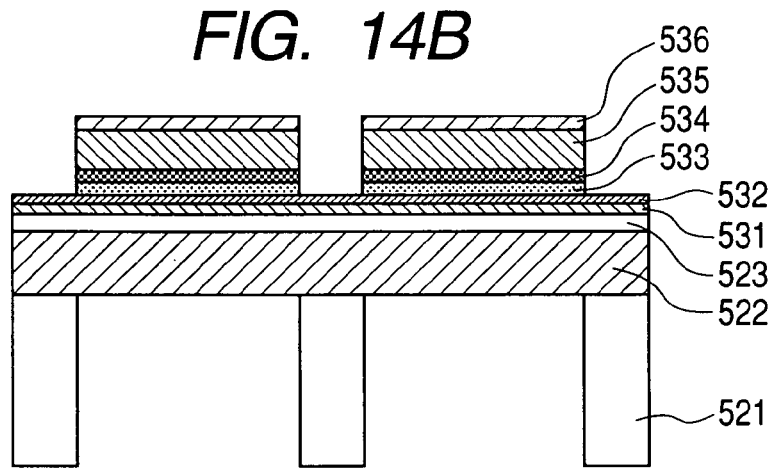
Figure 14C:
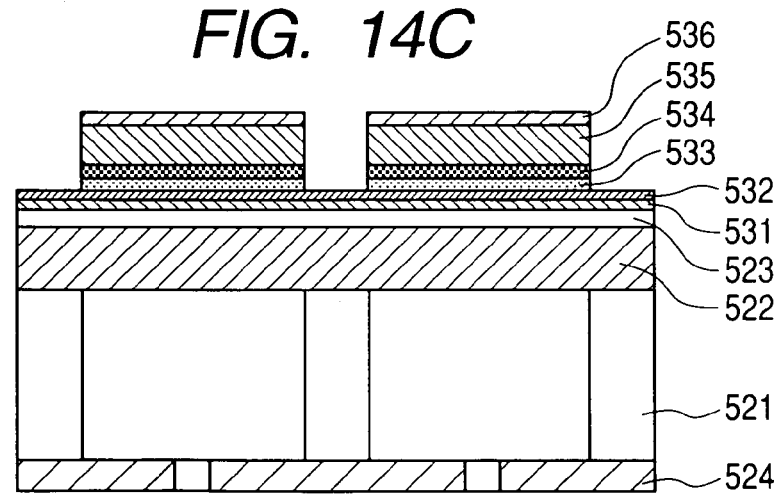

Then, as shown in FIG. 14A, useless portions of the PZT layer 535 are removed by the wet etching using fluoro-acid solution. In this case, the YSZ layer 531 and the $CeO_2$ layer 532 as the buffer layer act as an etching stopping layer. Then, as shown in FIG. 14B, the Si layer of ELTRAN is subjected to the wet etching using fluoro-acid solution to form the respective liquid chambers and the common liquid chamber. In this process, an $SiO_2$ layer 522 acts as an etching stopping layer and also acts as a vibrating plate. Lastly, a nozzle plate 524 which is a SUS substrate having a plurality of discharge ports formed therein is joined by an adhesive, thereby completing the printer head of the present invention.

In this wet etching treatment, the etching grade was 90 nm/min and the configuration of the PZT layer 535 after the etching was arranged substantially in perpendicular to the surface of the substrate, as desired.

Then, discharging tests of the printer head having the above-mentioned construction were performed. In the printer head according to the illustrated embodiment, it was found that a discharging amount of 10 pl and a discharging speed of 9 msec can be obtained by applying a sine wave of 20 V and 10 kHz, and there is no problem and an excellent printer head is provided.

This application claims priority from Japanese Patent Application No. 2004-253540 filed Aug. 31, 2004, which is hereby incorporated by reference herein.

What is claimed is:

1. A method for manufacturing a piezoelectric/electrostrictive element structure having a piezoelectric/electrostrictive film, and first and second electrodes between which said piezoelectric/electrostrictive film is sandwiched, the method comprising the steps of:
    forming a buffer layer on a substrate at least having a monocrystal surface, said buffer layer including a first oriented grown portion;
    forming said first electrode on said buffer layer, said first electrode including a second oriented grown portion corresponding to said first oriented grown portion;
    forming a piezoelectric/electrostrictive layer on at least said first electrode, said piezoelectric/electrostrictive layer including a first piezoelectric/electrostrictive portion disposed over said second oriented grown portion, and a second piezoelectric/electrostrictive portion not disposed over said second oriented grown portion, said first piezoelectric/electrostrictive portion and said second piezoelectric/electrostrictive portion being distributed in a direction perpendicular to a thickness direction of said piezoelectric/electrostrictive layer, a degree of orientation of said first piezoelectric/electrostrictive portion being higher than a degree of orientation of said second piezoelectric/electrostrictive portion; and
    removing said second piezoelectric/electrostrictive portion from said piezoelectric/electrostrictive layer so as to form said piezoelectric/electrostrictive film from said first piezoelectric/electrostrictive portion.

2. A method for manufacturing a piezoelectric/electrostrictive element structure according to claim 1, wherein said first piezoelectric/electrostrictive portion has epitaxial growth.

3. A method for manufacturing a piezoelectric/electrostrictive element structure according to claim 1, further comprising a step for forming said second electrode on said piezoelectric/electrostrictive layer between said step for forming said piezoelectric/electrostrictive layer and said step for removing said second piezoelectric/electrostrictive portion.

4. A method for manufacturing a piezoelectric/electrostrictive element structure according to claim 1, wherein said removing step comprises wet etching.

5. A method for manufacturing a piezoelectric/electrostrictive element structure according to claim 1, wherein said removing step comprises dry etching.

6. A method for manufacturing a piezoelectric/electrostrictive element structure according to claim 1, wherein said buffer layer is formed by forming a pattern-shaped orientation preventing layer on said monocrystal surface and by performing oriented growth of said buffer layer on a portion of said monocrystal surface other than the portion on which said orientation preventing layer is formed.

7. A method for manufacturing a piezoelectric/electrostrictive element structure according to claim 1, wherein said first electrode is comprised of perovskite oxide conductive material.

8. A method for manufacturing a piezoelectric/electrostrictive element structure according to claim 1, wherein said first electrode is comprised of an oxide of an $(Sr_x, Ca_y, Ba_z)RuO_3$ system, where $x+y+z=1$.

9. A method for manufacturing a piezoelectric/electrostrictive element structure according to claim 1, wherein said first electrode is comprised of an oxide of a $CNiO_3$ system, where C is at least one kind of element selected among La, Pr, Nd, Sm and Eu.

10. A method for manufacturing a piezoelectric/electrostrictive element structure having a piezoelectric/electrostrictive film, and first and second electrodes between which said piezoelectric/electrostrictive film is sandwiched, the method comprising the steps of:
    forming a buffer layer having oriented growth on a substrate at least having a monocrystal surface;
    forming said first electrode in a pattern having oriented growth on said buffer layer;
    forming a piezoelectric/electrostrictive layer on at least said first electrode, said piezoelectric/electrostrictive layer including a first piezoelectric/electrostrictive portion disposed over the pattern of said first electrode, and a second piezoelectric/electrostrictive portion not disposed over the pattern of said first electrode, said first piezoelectric/electrostrictive portion and said second piezoelectric/electrostrictive portion being distributed in a direction perpendicular to a thickness direction of said piezoelectric/electrostrictive layer, a degree of orientation of said first piezoelectric/electrostrictive portion being higher than a degree of orientation of said second piezoelectric/electrostrictive portion; and removing said second piezoelectric/electrostrictive portion from said piezoelectric/electrostrictive layer so as to form said piezoelectric/electrostrictive film from said first piezoelectric/electrostrictive portion.

11. A method for manufacturing a piezoelectric/electrostrictive element structure according to claim 10, wherein said first piezoelectric/electrostrictive portion corresponding to the pattern of said first electrode has epitaxial growth.

12. A method for manufacturing a piezoelectric/electrostrictive element structure according to claim 10, further comprising a step for forming said second electrode on said piezoelectric/electrostrictive layer between said step for forming said piezoelectric/electrostrictive layer and said step for removing said second piezoelectric/electrostrictive portion.

13. A method for manufacturing a piezoelectric/electrostrictive element structure according to claim 10, wherein said removing step comprises wet etching.

14. A method for manufacturing a piezoelectric/electrostrictive element structure according to claim 10, wherein said removing step comprises dry etching.

15. A method for manufacturing a liquid jet head comprising a liquid chamber communicating with a discharge port for discharging liquid, and a piezoelectric/electrostrictive element structure provided in correspondence to said liquid chamber and having a piezoelectric/electrostrictive film, and first and second electrodes between which said piezoelectric/electrostrictive film is sandwiched, the method comprising the steps of:

forming a buffer layer on a substrate at least having a monocrystal surface, said buffer layer including a first oriented grown portion;

forming said first electrode on said buffer layer, said first electrode including a second oriented grown portion corresponding to said first oriented grown portion;

forming a piezoelectric/electrostrictive layer on at least said first electrode, the piezoelectric/electrostrictive layer including a first piezoelectric/electrostrictive portion disposed over said second oriented grown portion, and a second piezoelectric/electrostrictive portion not disposed over said second oriented grown portion, said first piezoelectric/electrostrictive portion and said second piezoelectric/electrostrictive portion being distributed in a direction perpendicular to a thickness direction of said piezoelectric/electrostrictive layer, a degree of orientation of said first piezoelectric/electrostrictive portion being higher than a degree of orientation of said second piezoelectric/electrostrictive portion; and removing said second piezoelectric/electrostrictive portion from said piezoelectric/electrostrictive layer so as to form said piezoelectric/electrostrictive film from said first piezoelectric/electrostrictive portion.

16. A method for manufacturing a liquid jet head comprising a liquid chamber communicating with a discharge port for discharging liquid, and a piezoelectric/electrostrictive element structure provided in correspondence to said liquid chamber and having a piezoelectric/electrostrictive film, and first and second electrodes between which said piezoelectric/electrostrictive film is sandwiched, the method comprising the steps of:

forming a buffer layer having oriented growth on a substrate at least having a monocrystal surface;

forming said first electrode in a pattern having oriented growth on said buffer layer;

forming a piezoelectric/electrostrictive layer on at least said first electrode, said piezoelectric/electrostrictive layer including a first piezoelectric/electrostrictive portion disposed over the pattern of said first electrode, and a second piezoelectric/electrostrictive portion not disposed over the pattern of said first electrode, said first piezoelectric/electrostrictive portion and said second piezoelectric/electrostrictive portion being distributed in a direction perpendicular to a thickness direction of said piezoelectric/electrostrictive layer, a degree of orientation of said first piezoelectric/electrostrictive portion being higher than a degree of orientation of said second piezoelectric/electrostrictive portion; and removing said second piezoelectric/electrostrictive portion from said piezoelectric/electrostrictive layer so as to form said piezoelectric/electrostrictive film from said first piezoelectric/electrostrictive portion.

17. A method for manufacturing a piezoelectric/electrostrictive element structure having a piezoelectric/electrostrictive film, and first and second electrodes between which said piezoelectric/electrostrictive film is sandwiched, the method comprising the steps of:

forming a buffer layer on a substrate at least having a monocrystal surface, said buffer layer including a first oriented grown region;

forming said first electrode on said buffer layer, said first electrode including a second oriented grown region corresponding to said first oriented grown region;

forming a piezoelectric/electrostrictive layer on at least said first electrode, said piezoelectric/electrostrictive layer including a first piezoelectric/electrostrictive region disposed over said second oriented grown region, and a second piezoelectric/electrostrictive region not disposed over said second oriented grown portion, said first piezoelectric/electrostrictive region and said second piezoelectric/electrostrictive region being distributed in a direction perpendicular to a thickness direction of said piezoelectric/electrostrictive layer, a degree of orientation of said first piezoelectric/electrostrictive region being higher than a degree of orientation of said second piezoelectric/electrostrictive region; and removing said second piezoelectric/electrostrictive region from said piezoelectric/electrostrictive layer so as to form said piezoelectric/electrostrictive film from said first piezoelectric/electrostrictive region.

18. A method for manufacturing a piezoelectric/electrostrictive element structure having a piezoelectric/electrostrictive film, and first and second electrodes between which said piezoelectric/electrostrictive film is sandwiched, the method comprising the steps of:

forming a buffer layer having oriented growth on a substrate at least having a monocrystal surface;

forming said first electrode in a pattern having oriented growth on said buffer layer;

forming a piezoelectric/electrostrictive layer on at least said first electrode, said piezoelectric/electrostrictive layer including a first piezoelectric/electrostrictive region disposed over the pattern of said first electrode, and a second piezoelectric/electrostrictive region not disposed over the pattern of said first electrode, said first piezoelectric/electrostrictive region and said second piezoelectric/electrostrictive region being distributed in a direction perpendicular to a thickness direction of said piezoelectric/electrostrictive layer, a degree of orientation of said first piezoelectric/electrostrictive region being higher than a degree of orientation of said second piezoelectric/electrostrictive region; and removing said second piezoelectric/electrostrictive region from said piezoelectric/electrostrictive layer so as to form said piezoelectric/electrostrictive film from said first piezoelectric/electrostrictive region.

19. A method for manufacturing a liquid jet head comprising a liquid chamber communicating with a discharge port for discharging liquid, and a piezoelectric/electrostrictive element structure provided in correspondence to said liquid chamber and having a piezoelectric/electrostrictive film, and first and second electrodes between which said piezoelectric/electrostrictive film is sandwiched, the method comprising the steps of:

forming a buffer layer on a substrate at least having a monocrystal surface, said buffer layer including a first oriented grown region;

forming said first electrode on said buffer layer, said first electrode including a second oriented grown region corresponding to said first oriented grown region;

forming a piezoelectric/electrostrictive layer on at least said first electrode, the piezoelectric/electrostrictive layer including a first piezoelectric/electrostrictive region disposed over said second oriented grown region, and a second piezoelectric/electrostrictive region not disposed over said second oriented grown region, said first piezoelectric/electrostrictive region and said second piezoelectric/electrostrictive region being distributed in a direction perpendicular to a thickness direction of said piezoelectric/electrostrictive layer, a degree of orientation of said first piezoelectric/electrostrictive region being higher than a degree of orientation of said second piezoelectric/electrostrictive region; and removing said second piezoelectric/electrostrictive region from said piezoelectric/electrostrictive layer so as to form said piezoelectric/electrostrictive film from said first piezoelectric/electrostrictive region.

20. A method for manufacturing a liquid jet head comprising a liquid chamber communicating with a discharge port for discharging liquid, and a piezoelectric/electrostrictive element structure provided in correspondence to said liquid chamber and having a piezoelectric/electrostrictive film, and first and second electrodes between which said piezoelectric/electrostrictive film is sandwiched, the method comprising the steps of:

forming a buffer layer having oriented growth on a substrate at least having a monocrystal surface;

forming said first electrode in a pattern having oriented growth on said buffer layer;

forming a piezoelectric/electrostrictive layer on at least said first electrode, said piezoelectric/electrostrictive layer including a first piezoelectric/electrostrictive region disposed over the pattern of said first electrode, and a second piezoelectric/electrostrictive region not disposed over the pattern of said first electrode, said first piezoelectric/electrostrictive region and said second piezoelectric/electrostrictive region being distributed in a direction perpendicular to a thickness direction of said piezoelectric/electrostrictive layer, a degree of orientation of said first piezoelectric/electrostrictive region being higher than a degree of orientation of said second piezoelectric/electrostrictive region; and removing said second piezoelectric/electrostrictive region from said piezoelectric/electrostrictive layer so as to form said piezoelectric/electrostrictive film from said first piezoelectric/electrostrictive region.

* * * * *